United States Patent
Choi

(10) Patent No.: US 9,753,651 B2
(45) Date of Patent: Sep. 5, 2017

(54) MEMORY SYSTEM, MEMORY MODULE, AND METHODS OF OPERATING THE SAME

(71) Applicant: Samsung Electronics Co., Ltd., Suwon-si (KR)

(72) Inventor: Jung-Hwan Choi, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 87 days.

(21) Appl. No.: 14/803,116

(22) Filed: Jul. 20, 2015

(65) Prior Publication Data

US 2016/0117101 A1 Apr. 28, 2016

(30) Foreign Application Priority Data

Oct. 27, 2014 (KR) .................. 10-2014-0145663

(51) Int. Cl.
*G11C 7/10* (2006.01)
*G06F 3/06* (2006.01)
*G11C 5/04* (2006.01)

(52) U.S. Cl.
CPC ............ *G06F 3/061* (2013.01); *G06F 3/0635* (2013.01); *G06F 3/0659* (2013.01); *G06F 3/0688* (2013.01); *G11C 5/04* (2013.01); *G11C 7/10* (2013.01)

(58) Field of Classification Search
CPC .... G11C 5/04; G11C 7/10; G11C 5/06; G06F 3/0659; G06F 13/1684; G06F 3/061; G06F 3/0635; G06F 3/0688
See application file for complete search history.

(56) References Cited

U.S. PATENT DOCUMENTS

| | | |
|---|---|---|
| 6,317,352 B1 | 11/2001 | Halbert et al. |
| 7,024,518 B2 | 4/2006 | Halbert et al. |
| 7,093,076 B2 | 8/2006 | Kyung |
| 7,254,663 B2 | 8/2007 | Bartley et al. |
| 7,533,212 B1 | 5/2009 | Doblar et al. |
| 7,679,133 B2 | 3/2010 | Son et al. |
| 7,800,918 B2 | 9/2010 | Saeki |
| 7,844,771 B2 | 11/2010 | Gower et al. |
| 7,934,070 B2 | 4/2011 | Brittain et al. |
| 8,208,277 B2 | 6/2012 | Hofstra |
| 8,553,466 B2 | 10/2013 | Han et al. |
| 8,559,235 B2 | 10/2013 | Yoon et al. |
| 8,654,587 B2 | 2/2014 | Yoon et al. |

(Continued)

FOREIGN PATENT DOCUMENTS

JP  2011-108123 A  6/2011

*Primary Examiner* — Hashem Farrokh
(74) *Attorney, Agent, or Firm* — Muir Patent Law, PLLC

(57) ABSTRACT

A memory system includes a memory controller, a first memory module and second through k-th memory modules. The first memory module is directly coupled to the memory controller without any other memory modules communicatively coupled therebetween, through a first memory bus, and the first memory module exchanges first data with the memory controller. The second through k-th memory modules are coupled to the first memory module with a multi-drop connection through a second memory bus and the second through k-th memory modules exchange second data with the memory controller via the first memory module.

20 Claims, 28 Drawing Sheets

(56) References Cited

U.S. PATENT DOCUMENTS

| | | | |
|---|---|---|---|
| 2006/0036826 A1 | 2/2006 | Dell et al. | |
| 2010/0005281 A1* | 1/2010 | Buchmann | G06F 13/4243 |
| | | | 713/2 |
| 2010/0121994 A1 | 5/2010 | Kim et al. | |
| 2010/0162037 A1* | 6/2010 | Maule | G06F 11/106 |
| | | | 714/5.11 |
| 2011/0233648 A1 | 9/2011 | Seol et al. | |
| 2012/0260024 A1* | 10/2012 | Haywood | G06F 13/1642 |
| | | | 711/103 |

* cited by examiner

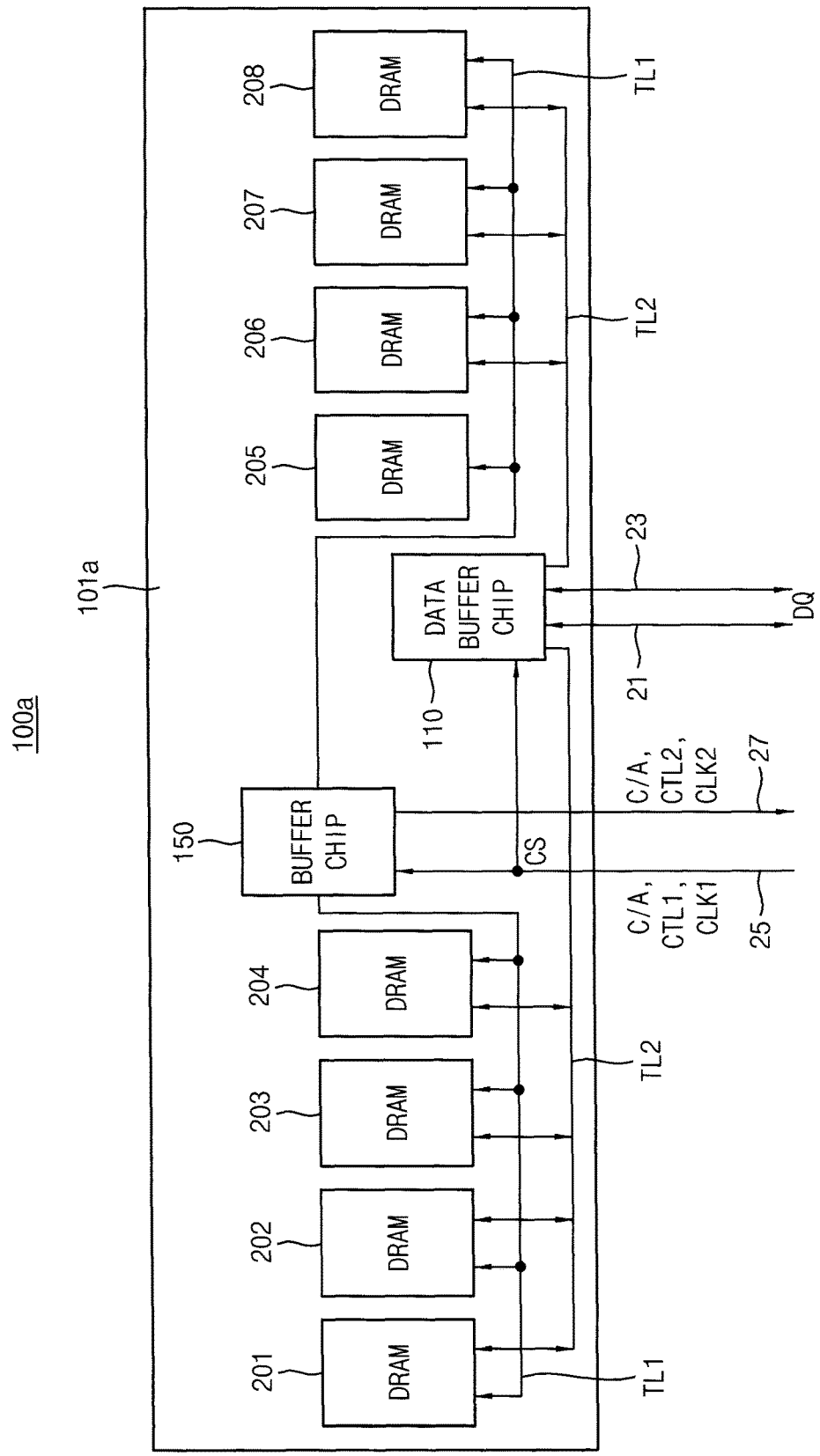

MEMORY SYSTEM, MEMORY MODULE, AND METHODS OF OPERATING THE SAME

CROSS-REFERENCE TO RELATED APPLICATION

This application claims priority under 35 USC §119 to Korean Patent Application No. 10-2014-0145663, filed on Oct. 27, 2014, in the Korean Intellectual Property Office (KIPO), the content of which is herein incorporated by reference in its entirety.

BACKGROUND

1. Technical Field

Example embodiments relate generally to memory modules, and more particularly to memory systems and methods of operating the same.

2. Description of the Related Art

For enhancing performance of a memory system, capacity of a memory module may be increased and/or operating frequency of the memory module may be increased. For example, for enhancing performance of the memory system, operating frequency of a channel connecting a memory controller and the memory module may be increased, or a number of memory modules connected to one channel may be increased. However, when the number of memory modules connected to one channel is increased, loading from the memory controller is also increased, and thus, it is difficult to increase the operating frequency.

SUMMARY

Some example embodiments provide a memory system, capable of increasing operating speed without decreasing storage capacity.

Some example embodiments provide a method of operating a memory system, capable of increasing operating speed without decreasing storage capacity.

According to example embodiments, a memory system includes a memory controller, a first memory module and second through k-th memory modules. The first memory module is directly coupled to the memory controller without any other memory modules communicatively connected therebetween, through a first memory bus and the first memory module exchanges first data with the memory controller. The second through k-th memory modules are coupled to the first memory module with a multi-drop connection through a second memory bus and the second through k-th memory modules exchange second data with the memory controller via the first memory module. k is a natural number greater than two.

In example embodiments, the first memory module may operate in a first mode in which the first memory module re-drives data from the memory controller to one of the second through k-th memory modules. The second through k-th memory modules may operate in a second mode in which the second through k-th memory modules receive the re-driven data.

In example embodiments, the first memory module may operate in a first mode in which the first memory module re-drives data from the memory controller to one of the second through k-th memory modules. At least one of the second through k-th memory modules may operate in the first mode and other memory module of the second through k-th memory modules except the at least one memory module may operate in a second mode in which the other memory modules receive the re-driven data.

In example embodiments, the first memory module is also configured to operate in a second mode in which the first memory module receives data from the memory controller and stores the data in a memory device of the first memory module.

In example embodiments, the first memory module may be a load-reduced dual in-line memory module (LRDIMM) and each of the second through k-th memory modules may be a registered dual in-line memory module (RDIMM).

In example embodiments, the first memory module may include a plurality of first memory chips, and a buffer device. The first buffer device may be configured to, in response to a chip selection signal, select between providing a command/address, a first control signal, and a first clock signal to the first memory devices, and re-driving the command/address, a second control signal, and a second clock signal to at least one of the second through k-th memory modules. The buffer device may be configured to, in response to the chip selection signal, select between providing data from the memory controller to at least one of the first memory devices as the first data, and re-driving the data from the memory controller to at least one of the second through k-th memory modules as the second data.

The buffer device may include a data buffer chip commonly coupled to the first memory chips.

The buffer device may include a first buffer circuit, a second buffer circuit, a third buffer circuit, a timing adjusting circuit, a path selection circuit and a control signal generator. The first buffer circuit may be coupled to the memory controller through a first data bus of the first memory bus. The second buffer circuit may be coupled to the second through k-th memory modules through a second data bus of the second memory bus. The third buffer circuit may be coupled to the first memory devices. The timing adjusting circuit may be coupled to the second buffer circuit. The path selection circuit may selectively connect the first buffer circuit to one of the third buffer circuit and the timing adjusting circuit, based on a selection signal. The control signal generator may generate the selection signal and a timing control signal in response to the chip selection signal and a mode signal included in the first control signal. The control signal generator may provide the selection signal to the path selection circuit and provide the timing control signal to the timing adjusting circuit.

When the path selection circuit connects the first buffer circuit to the timing adjusting circuit in response to the selection signal, the timing adjusting circuit may delay transmission timing of the data from the memory controller based on the timing control signal and may re-drive the data as the second data to an activated memory module of the second through k-th memory module, in response to the chip selection signal via the second buffer circuit.

In example embodiments, the control signal generator may generate the selection signal and a timing control signal in response to the chip selection signal. The control signal generator may provide the selection signal to the path selection circuit and may provide the timing control signal to the timing adjusting circuit.

Each of the second through k-th memory modules may include a plurality of second memory devices and a buffer device. The buffer device may provide the second memory chips with the command/address, the second control signal, and the second clock signal, in response the chip selection signal.

Each of the first memory devices may be a dynamic random access memory (DRAM) operating with a first clock frequency, each of the second memory devices may be a DRAM operating with a second clock frequency, and the first clock frequency may be higher than the second clock frequency.

In example embodiments, the first memory module may be a dynamic random access memory (DRAM) module including DRAM devices and each of the second through k-th memory modules may be a solid state disk (SSD) module including SSD devices.

The first memory module may include a plurality of DRAM devices each including one or more DRAM chips, and at least one data buffer chip. The at least one data buffer chip may store data from the memory controller in the DRAM chips or may re-drive the data received from the memory controller to at least one of the second through k-th memory modules in response to a chip selection signal. Each of the second through k-th memory modules may include a plurality of flash memory devices each including a three-dimensional memory array, and a storage controller. The storage controller may be coupled to the second memory bus, and may store the data re-driven from the first memory module in the flash memory chips based on a command/address re-driven from the first memory module.

Each of the nonvolatile memory chips may be a magnetic memory device.

Also, the first memory module may have a different configuration-type from the second through k-th memory modules.

According to example embodiments, a memory system includes a memory controller, a first memory module and second through k-th memory modules. The first memory module is directly coupled to the memory controller with a point-to-point connection through a first memory bus. The first memory module exchanges first data with the memory controller and the first memory module includes a plurality of first memory devices. The second through k-th memory modules are coupled to the first memory module with a multi-drop connection through a second memory bus. The second through k-th memory modules exchange second data with the memory controller via the first memory module, and each of the second through k-th memory modules includes a plurality of second memory devices. k is a natural number greater than two. The first memory module has a re-driving mode in which the first memory module re-drives data received from the memory controller to one of the second through k-th memory modules.

The first memory module may have a different configuration-type from the second through k-th memory modules.

In example embodiments, the first memory module may be a load-reduced dual in-line memory module (LRDIMM) and each of the second through k-th memory modules may be a registered dual in-line memory module (RDIMM).

In example embodiments, the first memory module may further include a first buffer device, configured to, in response to a chip selection signal, either provide a command/address, a first control signal, and a first clock signal to at least one of the first memory devices, or adjust timings of at least one of the command/address, the first control signal, and the first clock signal to re-drive the command/address, a second control signal and a second clock signal to at least one of the second through k-th memory modules; and either provide data from the memory controller to at least one of the first memory devices as the first data, or re-drive the data from the memory controller to at least one of the second through k-th memory modules as the second data.

In example embodiments, each of the first memory devices may be a dynamic random access memory (DRAM) operating with a first clock frequency and having a first latency, each of the second memory devices may be a DRAM operating with a second clock frequency and having a second latency, the first clock frequency may be higher than the second clock frequency, and the first latency may be smaller than the second latency.

In example embodiments, the first memory module may be a dynamic random access memory (DRAM) module including DRAM devices and each of the second through k-th memory modules may be a solid state disk (SSD) module including SSD devices.

According to example embodiments, in a method of operating a memory system including a memory controller, a first memory module directly coupled to the memory controller through a first memory bus and second through k-th memory modules coupled to the first memory module through a second memory bus (k being a natural number greater than two), write data, a command/address and a control signal from the memory controller are received by the first memory module. The command/address and the control signal are associated with the write data. The write data is stored in one or more memory devices in the first memory module when the first memory module is selected by a chip selection signal in the control signal. The write data is re-driven by the first memory module, to be provided to one of the second through k-th memory modules when one of the second through k-th memory modules is selected by the chip selection signal.

In example embodiments, the first memory module may be directly coupled to the memory controller with a point-to-point connection through the first memory bus, and the second through k-th memory modules may be coupled to the first memory module with a multi-drop connection through the second memory bus.

In example embodiments a memory module includes a plurality of first memory devices and a buffer device. The buffer device may be configured to receive data, an address, a control signal, and a clock signal, and may be further configured to select between providing the data, address, control signal, and clock signal to the first memory devices, and re-driving the data, address, control signal, and clock signal to a multi-drop bus for transmitting to a plurality of other memory modules.

In example embodiments, the buffer device is further configured to receive a selection signal from a controller, and perform the selecting step based on the selection signal.

In example embodiments, the buffer device includes a first buffer circuit for coupling to the controller through a first data bus, a second buffer circuit for coupling to the plurality of other memory modules through a second data bus, a third buffer circuit coupled to the first memory devices, a timing adjusting circuit coupled to the second buffer circuit, and a path selection circuit configured to selectively connect the first buffer circuit to one of the third buffer circuit and the timing adjusting circuit, based on the selection signal.

In example embodiments, a first memory module is directly coupled to a memory controller, is coupled to second through k-th memory modules with a multi-drop connection, and re-drives data from the memory controller to one of the second through k-th memory modules. In addition, memory chips mounted on the first memory module may operate with high speed. Therefore, the memory system may increase operating speed without decreasing storage capacity because the memory controller copes with a load of the first memory module directly coupled to the memory controller.

BRIEF DESCRIPTION OF THE DRAWINGS

Illustrative, non-limiting example embodiments will be more clearly understood from the following detailed description taken in conjunction with the accompanying drawings.

FIG. 3 is a block diagram illustrating an example of the first memory module in FIG. 2A according to some example embodiments.

DETAILED DESCRIPTION

Figure 1:
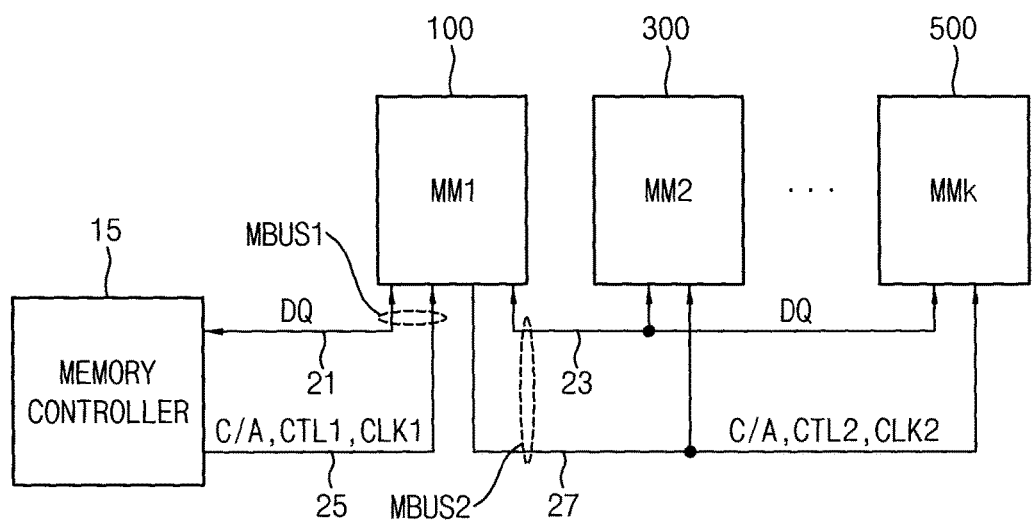
FIG. 1 is a block diagram illustrating a memory system according to example embodiments.

Various aspects of the inventive concept will now be described in some additional detail with reference to the accompanying drawings. This inventive concept may, however, be embodied in many different forms and should not be construed as being limited to only the illustrated embodiments. Throughout the written description and drawings, like reference numbers refer to like or similar elements and features.

It will be understood that, although the terms first, second, etc. may be used herein to describe various elements, these elements should not be limited by these terms, unless the context indicates otherwise. These terms are used to distinguish one element from another, for example, as a naming convention. For example, a first element in one section of the specification could be termed a second element in another section of the specification, and, similarly, a second element could be termed a first element, without departing from the scope of the disclosed embodiments. In addition, in certain cases, even if a term is not described using "first," "second," etc., in the specification, it may still be referred to as "first" or "second" in a claim in order to distinguish different claimed elements from each other. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described with reference to accompanying drawings. The same reference numerals will be used to refer to the same or similar elements throughout the drawings and detailed description about the same elements will be omitted in order to avoid redundancy.

FIG. 1 is a block diagram illustrating a memory system according to example embodiments.

Referring to FIG. 1, a memory system 10 may include a memory controller 15 and a plurality of memory modules 100 and 300~500.

The memory controller 15 may be directly coupled to the first memory module 100 through a first memory bus MBUS1. For example, the memory controller 15 may connect to and communicate with the first memory module 100 without the communications passing through any other memory modules (e.g., without other memory modules being communicatively coupled therebetween). The first memory module 100 may be coupled to the memory controller 15 with a point-to-point connection. The second through k-th (k is a natural number greater than two) memory modules 300~500 may be coupled to the first memory module 100 through a second memory bus MBUS2 with a multi-drop connection. Thus, each of the second through k-th memory modules 300-500 may be directly coupled to the first memory module 100 through the second memory bus MBUS2, but may be indirectly coupled to the memory controller 15 through the first memory module 100.

The first memory bus MBUS1 may include a first data bus 21 and a first control bus 25. The second memory bus MBUS2 may include a second data bus 23 and a second control bus 27. Each bus may include, for example, a plurality of lines each configured to transfer signals representing bits from one component to another.

The memory controller 15 may transmit data DQ to the first memory module 100 through the first data bus 21 and may transmit a command/address C/A, a first control signal CTL1 and a first clock signal CLK1 associated with a memory operation of the data DQ to the first memory module 100 through the first control bus 25.

The first memory module 100 may provide the data to at least one of memory devices of the first memory module 100 according to the command/address C/A, the first control signal CTL1, and the first clock signal CLK1 when the data DQ from the memory controller 15 is designated for the memory devices included in the first memory module 100.

The memory devices described herein may be semiconductor devices, such as a semiconductor memory chip, a stack of such chips, a semiconductor package including a package substrate and one or more semiconductor chips, or a package-on-package device, for example. These devices may be generally referred to herein as electronic devices. A semiconductor chip, or memory chip, as discussed herein, refers to an integrated circuit formed on a die, for example, from a wafer.

When the data DQ from the memory controller 15 is designated for one of the second through k-th memory modules 300~500, the first memory module 100 may re-drive the data DQ to one of the second through k-th memory modules 300~500 through the second data bus 23 and may re-drive the command/address C/A, a second control signal CTL2 and a second clock signal CLK2 associated with a memory operation of the data DQ to one of the second through k-th memory modules 300~500 through the second control bus 27. Re-driving a signal, such as data, a command, an address, a control signal, or a clock signal, as described herein refers to using a received signal to form a second signal that is further transmitted to another device or module. For example, the second signal may be derived from the first signal and may have the same characteristics as the received signal (e.g., the same data, address, or command), or it may have different characteristics (e.g., a different clock frequency) derived from the received signal. Thus, the first memory module 100 may forward and/or convert signals (e.g., data, address, control, and clock signals) received from the memory controller 15 to one of the second through k-th memory modules 300-500

The first memory module 100 may transmit data DQ from the memory devices in the first memory module 100 to the memory controller 15 through the first memory bus MBUS1. In addition, each of the second through k-th memory modules 300~500 may transmit data DQ from memory devices of each of the second through k-th memory modules 300~500 to the memory controller 15 via the first memory module 100.

Therefore, when the data DQ is associated with the first memory module 100, the first memory module 100 may exchange the data DQ with the memory controller 15 through the first memory bus MBUS1 as a first data. When the data DQ is associated with one of the second through k-th memory modules 300~500, the second through k-th memory modules 300~500 100 may exchange the data DQ with the memory controller 15 via the first memory module 100 as a second data.

In certain embodiments, the first memory module 100 may be a different kind of memory module from the second through k-th memory modules 300~500. In certain embodiments, the first memory module 100 may be a same kind of memory module from the second through k-th memory modules 300~500. As described herein, memory modules may be described as same configuration-type modules, which are both physically and operationally configured in the same way. Memory modules may be described as different configuration-type modules, which may be the same or different memory cell type, but either way, are physically and/or operationally configured differently. For example, two DRAM modules may have the same memory cell type (e.g., DRAM), but have different configuration-types. The term "kind" or "type" may refer generally to any of these memory cell types or configuration-types.

In one embodiment, the first memory module 100 and each of the second through k-th memory modules 300~500 may operate in different modes. For example, in one embodiment, the first memory module 100 may operate in a re-driving mode (a first mode) in which the first memory module 100 re-drives the data from the memory controller 15 to another memory module, and the second through k-th memory modules 300~500 may operate in a normal mode (a second mode) in which the second through k-th memory modules 300~500 receive the re-driven data.

Also, in certain situations, the first memory module 100 may operate in the normal mode, such as when it receives data and/or commands destined for itself. Thus, the first memory module 100 may be configured to switch between operating in the re-driving mode and in the normal mode. In addition, at least one of the second through k-th memory modules 300~500 may operate in the re-driving mode as the first memory module 100. For example, although not illustrated, the third memory module may be disposed between the second memory module 300 and the k-th memory module 500 and may be coupled to the first memory module 100 and k-th memory module 500. The third memory module may operate in the re-driving mode in which the third memory module re-drives the data from the first memory module 100 to the k-th memory module 500.

Figure 2A:
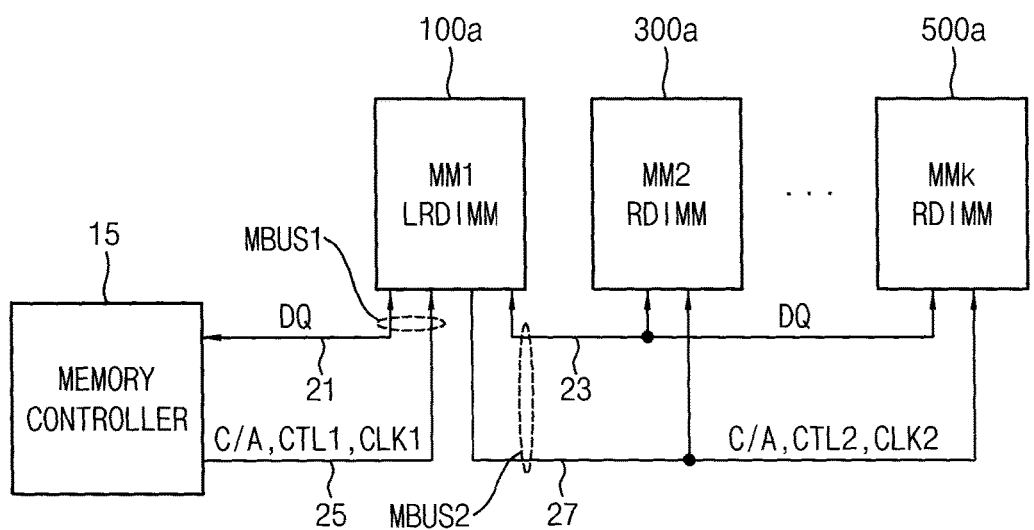
FIG. 2A illustrates kinds of the memory modules in the memory system of FIG. 1 according to example embodiments.

FIG. 2A illustrates certain kinds of the memory modules in the memory system of FIG. 1 according to example embodiments.

Referring to FIG. 2A, a memory system 10a may include a memory controller 15 and a plurality of memory modules 100a and 300a~500a.

A first memory module 100a of the memory modules 100a and 300a~500a may be a load-reduced dual in-line memory module (LRDIMM) and each of the second through k-th memory modules 300a~500a may be a registered dual in-line memory module (RDIMM).

The memory controller 15 may be directly coupled to the first memory module 100a through a first memory bus MBUS1. The first memory module 100a may be coupled to the memory controller 15 with a point-to-point connection. The second through k-th memory modules 300a~500a may be coupled to the first memory module 100a through a second memory bus MBUS2 with a multi-drop connection.

Figure 2B:
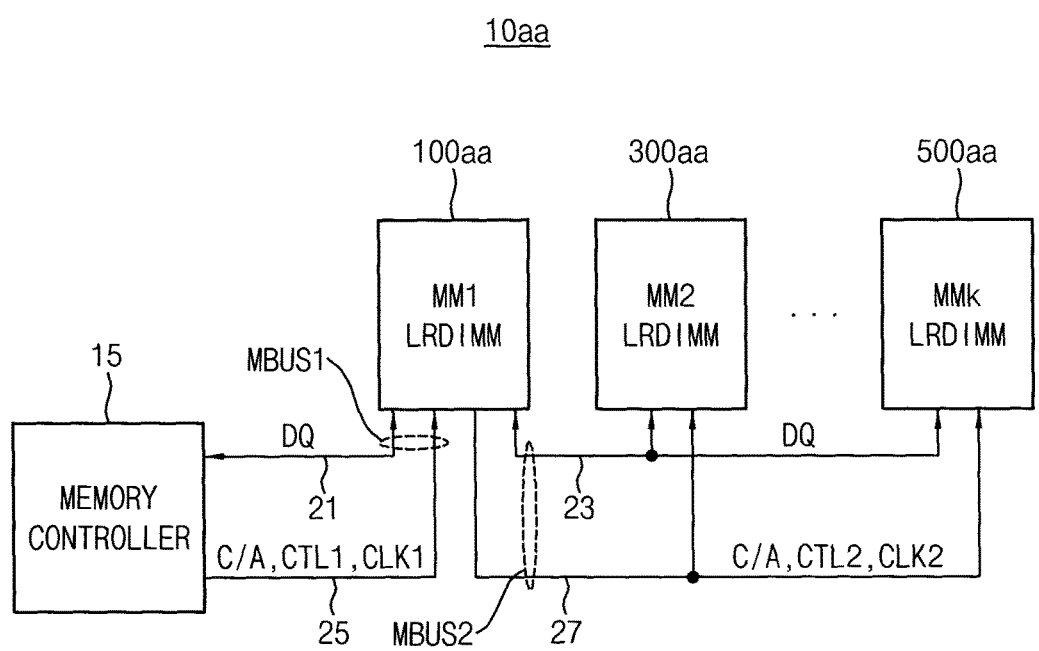
FIG. 2B illustrates kinds of the memory modules in the memory system of FIG. 1 according to example embodiments.

FIG. 2B illustrates certain kinds of the memory modules in the memory system of FIG. 1 according to example embodiments.

Referring to FIG. 2A, a memory system 10aa may include a memory controller 15 and a plurality of memory modules 100a and 300aa~500aa.

Each of the memory modules 100a and 300aa~500aa may be an LRDIMM.

The memory controller 15 may be directly coupled to the first memory module 100a through a first memory bus MBUS1. The first memory module 100aa may be coupled to the memory controller 15 with a point-to-point connection. The second through k-th memory modules 300aa~500aa may be coupled to the first memory module 100aa through a second memory bus MBUS2 with a multi-drop connection.

In the memory system 10aa of FIG. 2B, in one embodiment, the first memory module 100aa may operate in the re-driving mode and the second through k-th memory modules 300aa~500aa may operate in the normal mode. Also, in certain situations, the first memory module 100aa may operate in the normal mode, such as when it receives data and/or commands destined for itself. Thus, the first memory module 100aa may be configured to switch between operating in the re-driving mode and in the normal mode. In addition, at least one of the second through k-th memory modules 300aa~500aa may operate in the re-driving mode as with the first memory module 100aa. The term "normal mode" as used herein is used in relation to a re-driving mode, such that in a normal mode data is stored or accessed by the component that receives it, rather than being re-driven, or forwarded, to another component.

FIG. 3 is a block diagram illustrating an example of the first memory module in FIG. 2A according to some example embodiments.

Referring to FIG. 3, the first memory module 100a may be implemented with an LRDIMM. The first memory module 100a may include a plurality of memory devices 201~208 mounted on a module board 101a, a data buffer chip 110 and a buffer chip 150. In one embodiment, each of the memory devices 201~208 may be double data rate (DDR) 4 synchronous dynamic random access memory (SDRAM). Further each device 201~208 may include one or more semiconductor memory chips packaged in a semiconductor memory package.

The data buffer chip 110, referred to generally as a data buffer device, and which includes a data buffer, may be coupled to the memory controller 15 with a point-to-point connection through the first data bus 21 and may be coupled to the second through k-th memory modules 300a~500a with a multi-drop connection through the second data bus 23.

A data buffer chip 110 may determine which memory module is associated with the data DQ based on a chip selection signal CS. For example, when the data DQ is associated with the first memory module 100a by the chip selection signal CS, the data buffer chip 110 may store the data DQ in the memory devices 201~208 through a transmission line TL2 according to the command/address C/A, the first control signal CTL1, the first clock signal CLK1 or may transmit the data DQ from the memory devices 201~208 to the memory controller 15. When the data DQ is associated with one of the second through k-th memory modules 300a~500a by the chip selection signal CS, the data buffer chip 110 may re-drive the data DQ to one of the second through k-th memory modules 300a~500a, or may re-drive the data from one of the second through k-th memory modules 300a~500a to the memory controller 15. The data buffer chip may be, for example, an integrated circuit formed on a die that forms a data buffer device for performing buffering operations.

The buffer chip 150 may be coupled to the memory controller 15 with a point-to-point connection through the first control bus 25 and may be coupled to the second through k-th memory modules 300a~500a with a multi-drop connection. The buffer chip 150 may receive the command/address C/A, the first control signal CTL1 and the first clock signal CLK1 associated with memory operation of the data DQ from the memory controller 15, and may determine which memory module is associated with the data DQ by a chip selection signal CS in the first control signal CTL1. For example, when the data DQ is associated with the first memory module 100a by the chip selection signal CS, the buffer chip 150 may provide the memory devices 201~208 with the command/address C/A, the first control signal CTL1 and the first clock signal CLK1 associated with the memory operation of the data DQ through a transmission line TL1. When the data DQ is associated with one of the second through k-th memory modules 300a~500a by the chip selection signal CS, the buffer chip 150 may adjust timing of at least one of the command/address C/A, the first control signal CTL1 and the first clock signal CLK1 associated with the memory operation of the data DQ and may re-drive the command address C/A, a second control signal CTL2 and a second clock signal CLK2 to one of the second through k-th memory modules 300a~500a.

The data buffer chips and the buffer chip may each include, for example, an integrated circuit formed on a die that forms a data buffer for performing buffering operations. Though the data buffer chips and the buffer chip are described as separate chips, they may be integrated on a single device, such as a single chip. Whether on separate chips or together in a single chip, the data buffer chips and/or buffer chip may be referred to herein either individually or as a combination as a buffer device, or buffer system, or simply a buffer.

Figure 4:
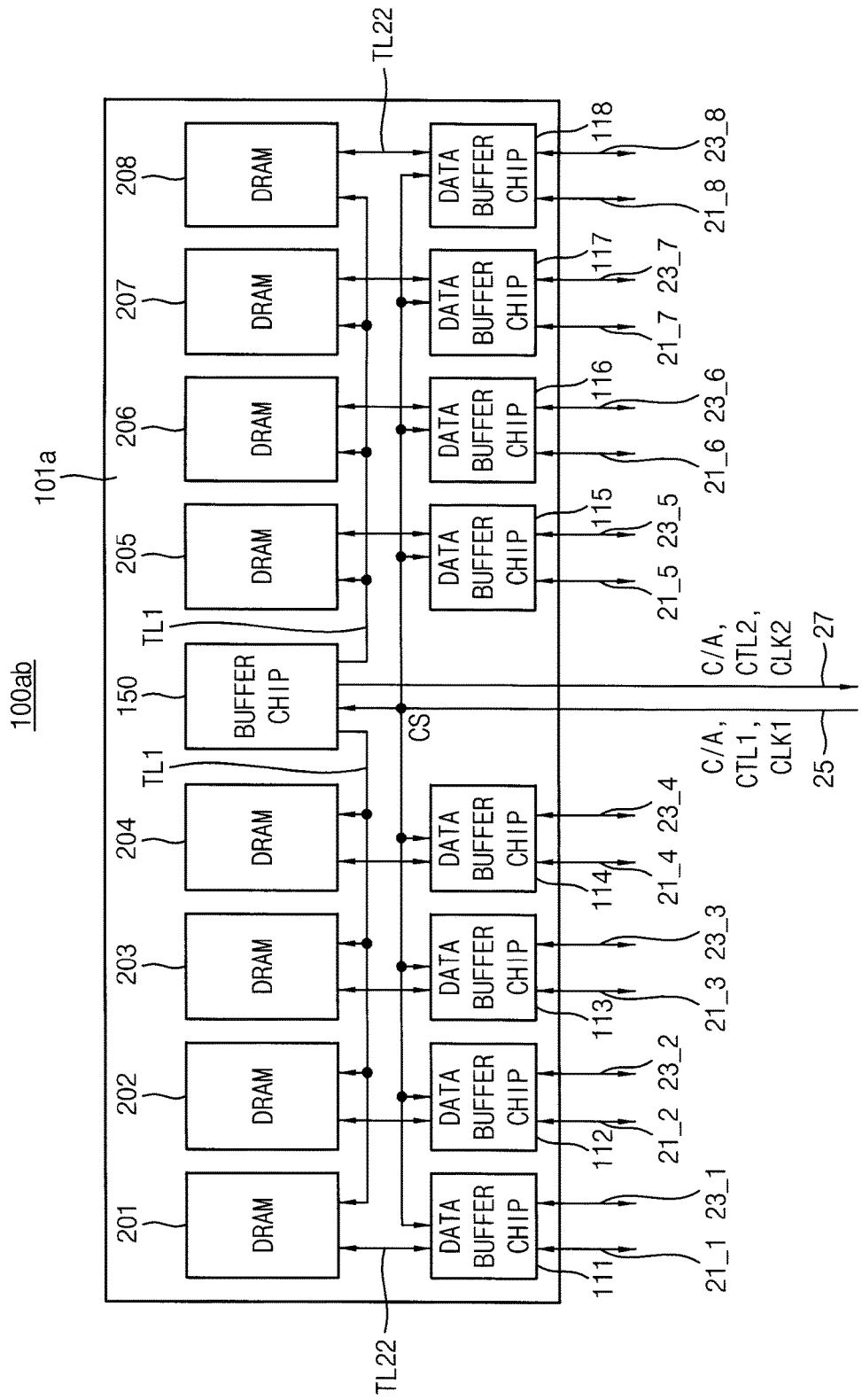
FIG. 4 is a block diagram illustrating another example of the first memory module in FIG. 2A according to some example embodiments.
Figure 5A:
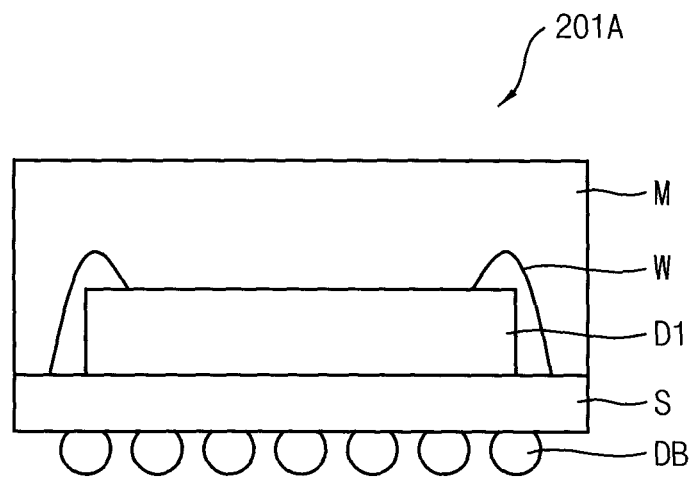
FIGS. 5A through 7 are side cross-sectional views illustrating exemplary package types of memory devices of the first memory module 10 of FIG. 3.
Figure 5B:
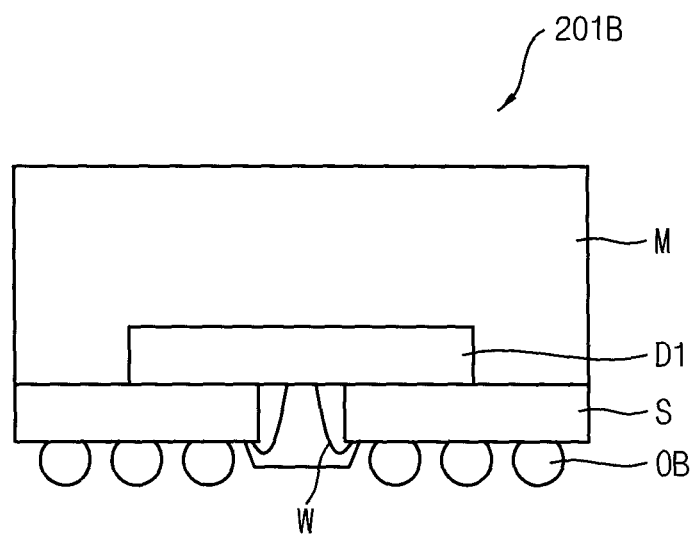
Figure 5C:
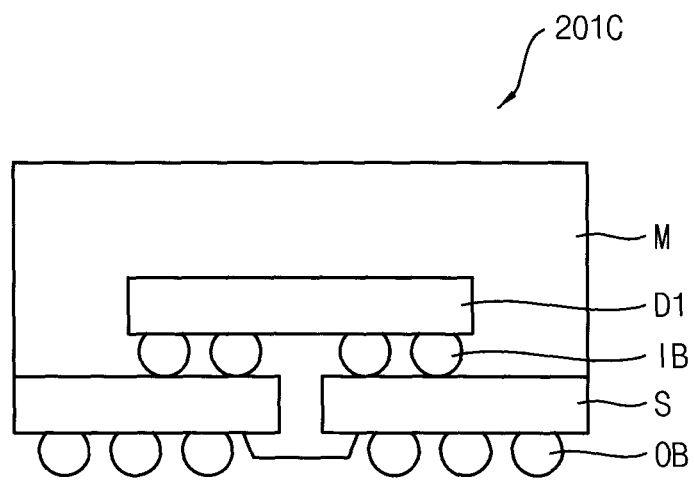
Figure 6A:
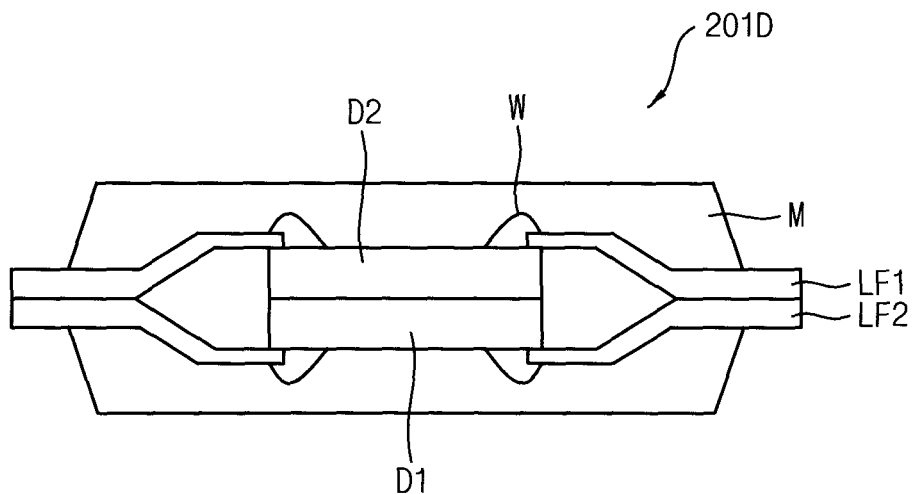
Figure 6B:
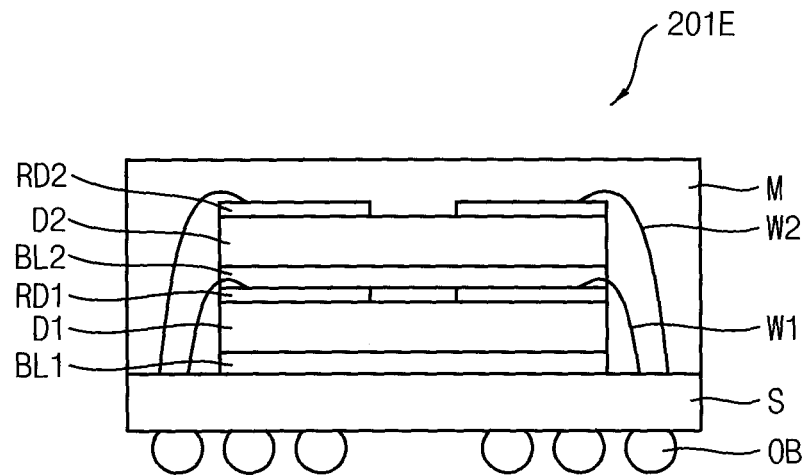
Figure 6C:
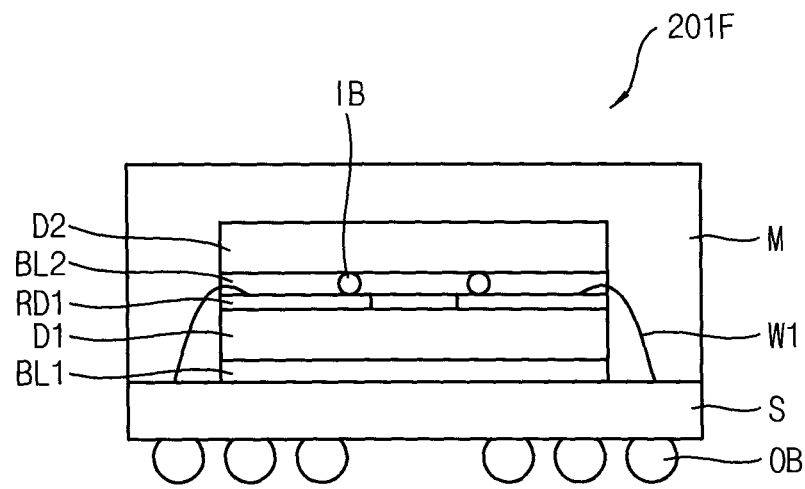

FIG. 4 is a block diagram illustrating another example of the first memory module in FIG. 2A according to some example embodiments.

Referring to FIG. 4, the first memory module 100*ab* may be implemented with an LRDIMM. The first memory module 100*ab* may include a plurality of memory devices 201~208 mounted on a module board 101*a*, a plurality of data buffer chips 111~118 and a buffer chip 150. Each of the memory devices 201~208 may be DDR4 SDRAM.

Each of the data buffer chips 111~118 may be coupled to the memory controller 15 with a point-to-point connection through each of first data buses 21_1~21_8 and may be coupled to the second through k-th memory modules 300*a*~500*a* with a multi-drop connection through second data buses 23_1~23_8.

Each of the data buffer chips 111~118 may determine which memory module is associated with the data DQ based on a chip selection signal CS. For example, when the data DQ is associated with the first memory module 100*ab* by the chip selection signal CS, the data buffer chip 110 may store the data DQ in the memory devices 201~208 through a transmission line TL22 according to the command/address C/A, the first control signal CTL1 and the first clock signal CKL1, or may transmit the data DQ from the memory devices 201~208 to the memory controller 105. When the data DQ is associated with one of the second through k-th memory modules 300*a*~500*a* by the chip selection signal CS, each of the data buffer chips 111~118 may re-drive the data DQ to one of the second through k-th memory modules 300*a*~500*a*, or may re-drive the data from one of the second through k-th memory modules 300*a*~500*a* to the memory controller 15.

When the first memory module 100*a* is implemented with an LRDIMM in FIG. 2A, the first memory module 100*a* may include the data buffer chip 110 commonly coupled to the memory devices 201~208 as described with reference to FIG. 3, or the first memory module 100*a* may include the data buffer chips 111~118, each coupled to each of the memory devices 201~208 as described with reference to FIG. 4.

FIGS. 5A through 7 are side cross-sectional views illustrating package types of memory devices of the first memory module 10 of FIG. 3, according to certain exemplary embodiments.

For convenience of explanation, each of semiconductor devices will be hereinafter described as an individual memory device, for example, dynamic random access memory (DRAM) or magnetic random access memory (MRAM), but they are not limited thereto and may be a combination of individual memory devices (e.g., different dies to form a memory device having different types of chips). The package types of memory chips illustrated in FIGS. 5A through 7 are just illustrative examples, and the memory devices 201~208 illustrated in FIG. 3 may be any of various package types.

Referring to FIGS. 3 and 5A to 5C, the memory device 201 of the first memory module 100*aa* may be packaged in one of mono die structures 201A, 201B, and 201C.

The mono die structure 201A may include a single semiconductor die D1 mounted on a substrate S, bonding wires W that electrically connect the substrate S and the semiconductor die D1, and a sealing member M that seals the semiconductor die D1 and the bonding wires W. In the mono die structure 201A, external connecting members OB, e.g., conductive bumps, may be formed on a lower surface of the substrate S, and the semiconductor die D1 may be electrically connected to buses formed on the module board via the external connecting members OB. Although not shown, an adhering member may be disposed between the semiconductor die D1 and the substrate S.

The mono die structure 201B may be similar to the mono die structure 201A, except that a central part of a substrate S may be open and a semiconductor die D1 and the substrate S may be electrically connected in the open part of the substrate S, via bonding wires W. For example, the mono die structure 201B may have a board on chip (BOC) structure.

The mono die structure 201C may be similar to the mono die structure 201B except that a semiconductor die D1 and a substrate S may be electrically connected via internal connecting members IB, e.g., conductive bumps.

Referring to FIGS. 3 and 6A to 6C, the memory device 201 of the first memory module 100*aa* may be packaged in one of dual die structures 201D, 201E, and 201F.

The dual die structure 201D may include an upper lead LF1 and a lower lead LF2 that are bonded with each other in such a manner that central parts thereof are respectively bent in opposite directions. Semiconductor dies D1 and D2 are disposed facing each other between the upper and lower leads LF1 and LF2. A sealing member M seals the semiconductor dies D1 and D2 and the upper and lower leads LF1 and LF2 to expose portions of the upper and lower leads LF1 and LF2 outside the sealing member M. The semiconductor dies D1 and D2 may be electrically connected to the upper lead LF1 and the lower lead LF2 via bonding wires W, respectively. In the dual die structure 11D, the semiconductor dies D1 and D2 may be electrically connected to buses formed on the module board via portions of the upper lead LF1 and the lower lead LF2 exposed outside the sealing member M.

The dual die structure 201E may include semiconductor dies D1 and D2 that are sequentially stacked on a substrate S, bonding wires W1 and W2 that are connected to redistribution layers RD1 on the semiconductor die D1 and redistribution layers RD2 on the semiconductor die D2 and a pad (not shown) of the substrate S and that electrically connect the semiconductor dies D1 and D2 to the substrate S, and a sealing member M that seals the semiconductor dies D1 and D2 and the bonding wires W1 and W2. An adhering member BL1 may be disposed between the semiconductor die D1 and the substrate S, and may be disposed between the semiconductor dies D1 and D2. Another adhering member BL2 may be disposed between the redistribution layers RD1 of the semiconductor die D1 and the semiconductor die D2. In the dual die structure 11E, external connecting members OB, e.g., conductive bumps, may be formed on a lower surface of the substrate S, and the semiconductor dies D1 and D2 may be electrically connected to the buses formed on the module board via the external connecting members OB.

The dual die structure 201F may be similar to the dual die structure 201E except that a semiconductor die D1 and a semiconductor die D2 may face each other and may have an adhering member BL2 therebetween. The semiconductor die D2 may be electrically connected to the semiconductor die D1 via internal connecting members IB connected to redistribution layers RD1 on the semiconductor die D1. The semiconductor dies D1 and D2 may be electrically connected to the substrate S via bonding wires W connected to the redistribution layers RD1 on the semiconductor die D1 and the substrate S.

Figure 7:
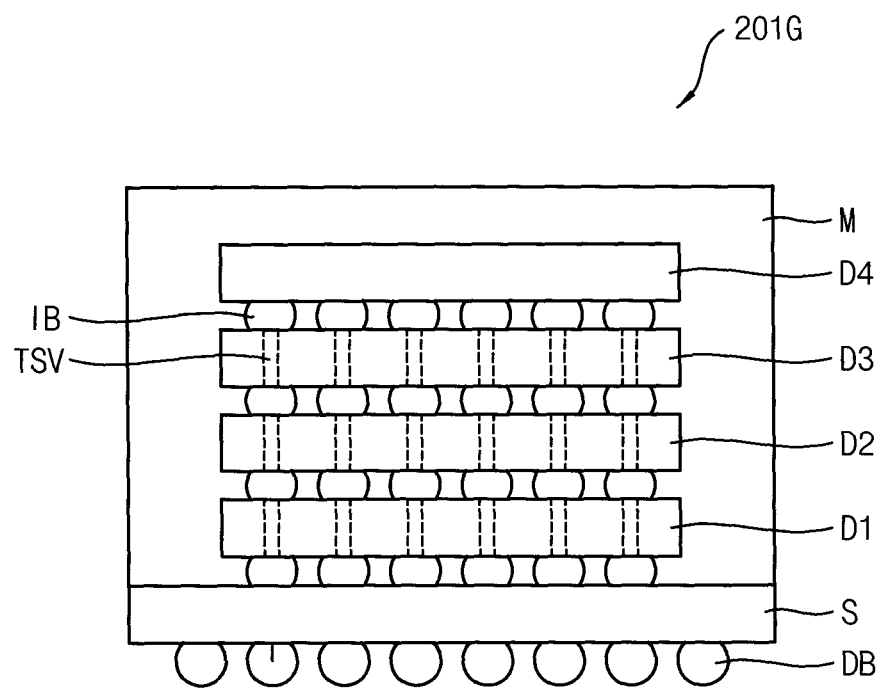

Referring to FIGS. 3 and 7, the memory device 201 of the first memory module 100aa may be packaged in a stacked die structure 11G using, for example through substrate vias (TSV)s, such as through silicon vias.

The stacked die structure 201G using TSVs may include a plurality of semiconductor dies D1 to D4 that are sequentially stacked on a substrate S, and a sealing member M that seals the semiconductor dies D1 to D4. In the stacked die structure 11G, the semiconductor dies D1 to D4 may be electrically connected via internal connecting members IB, e.g., conductive bumps and the TSVs. Although the semiconductor dies D1 to D4 according to an exemplary embodiment have been described as a stacked structure in which the semiconductor dies D1 to D4 are connected via the internal connecting members IB and the TSVs, the inventive concept is not limited thereto, and the semiconductor dies D1 to D4 may be a stacked structure in which the semiconductor dies D1 to D4 are connected via wire bonding, interposers, or tapes having wires, for example.

Alternatively, in one embodiment, signals may be exchanged between the semiconductor dies D1 to D4 by using optical input/output (IO) connection. For example, the semiconductor dies D1 to D4 may be connected according to a radiative method using radio-frequency (RF) waves or ultrasonic waves, an inductive coupling method using magnetic induction, or a non-radiative method using magnetic field oscillation.

In the radiative method, signals are wirelessly transmitted via an antenna, e.g., a monopole antenna or a planar inverted-F antenna (PIFA). Radiation occurs when electric fields or magnetic fields that change according to time are influenced by each other. When antennas of the same frequency are used, signals may be received according to polarization characteristics of incident waves.

In the inductive coupling method, a strong magnetic field is generated in one direction by a coil wound with several turns, and coils that oscillate at similar frequencies are disposed adjacent to each other causing coupling to occur.

The non-radiative method is based on evanescent wave coupling that cause electromagnetic waves to move between two media that oscillate at the same frequency by using a near-field electromagnetic field.

In the stacked die structure 201G, external connecting members OB, e.g., conductive bumps, may be formed on a lower surface of the substrate S, and the semiconductor dies D1 to D4 may be electrically connected to the buses on the module board via the external connecting members OB.

Figure 8:
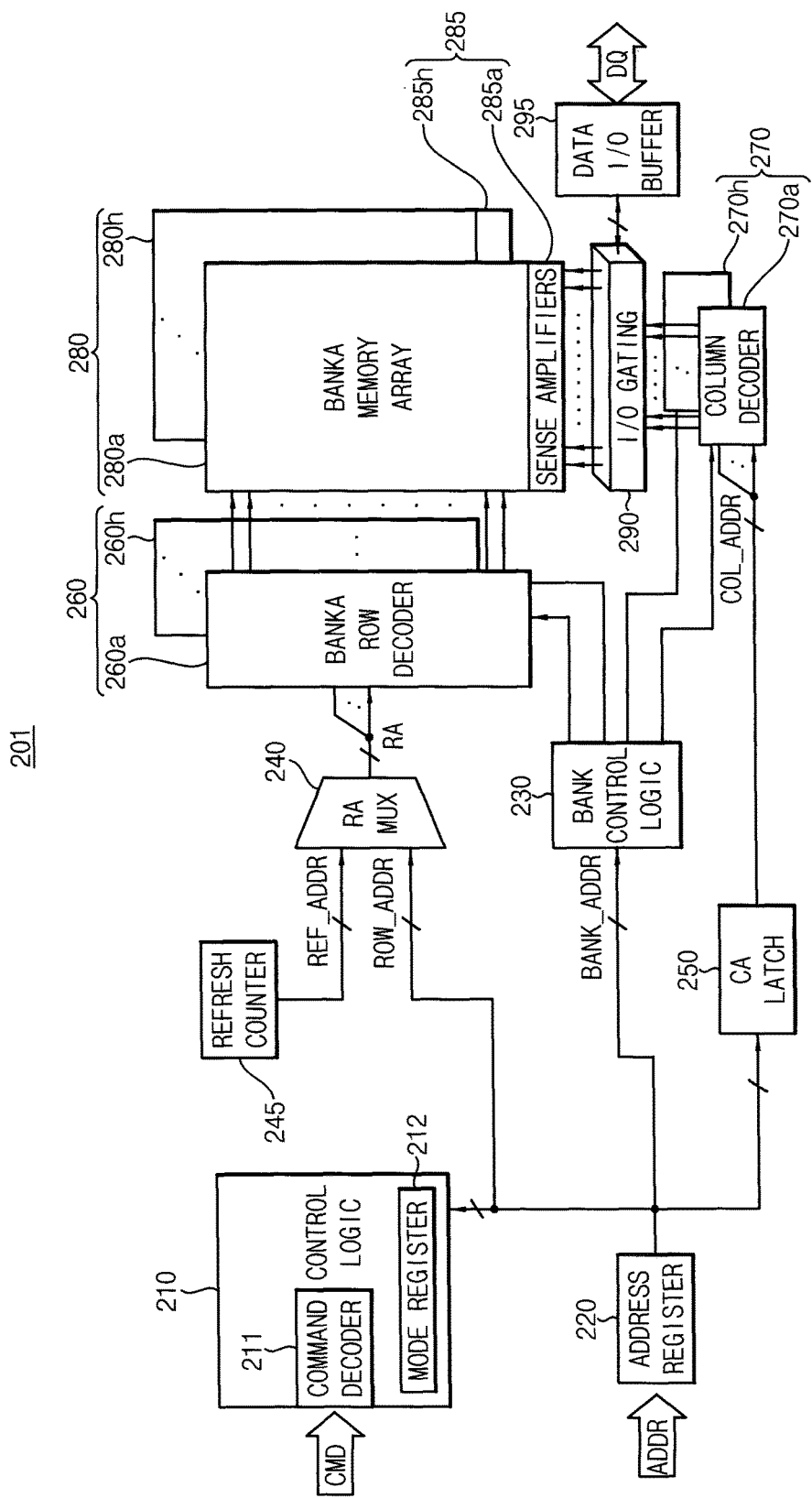
FIG. 8 is a block diagram illustrating an example of one of the memory devices in the memory module of FIG. 3 according to example embodiments.

FIG. 8 is a block diagram illustrating an example of one of the memory devices in the memory module of FIG. 3 according to example embodiments.

Referring to FIG. 3, the memory device 201 may include a control logic 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, and a refresh counter 245. These components may be included in one chip, or may be included in a memory device 201 that includes a plurality of chips.

The memory cell array 280 may include first through eighth bank arrays 280a~280h. The row decoder 260 may include first through eighth bank row decoders 260a~260h respectively coupled to the first through eighth bank arrays 280a~280h, the column decoder 270 may include first through eighth bank column decoders 270a~270h respectively coupled to the first through eighth bank arrays 280a~280h, and the sense amplifier unit 285 may include first through eighth bank sense amplifiers 285a~285h respectively coupled to the first through eighth bank arrays 280a~280h. The first through eighth bank arrays 280a~280h, the first through eighth bank row decoders 260a~260h, the first through eighth bank column decoders 270a~270h and first through eighth bank sense amplifiers 285a~285h may form first through eighth banks Although the memory device 201 is illustrated in FIG. 8 as including eight banks, the memory device 201 may include any number of banks.

The address register 220 may receive an address ADDR including a bank address BANK_ADDR, a row address ROW_ADDR and a column address COL_ADDR from the memory controller 15. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 in order to output data corresponding to the column address COL_ADDR.

The I/O gating circuit 290 may include a circuitry for gating input/output data. The I/O gating circuit 290 may further include read data latches for storing data that is output from the first through eighth bank arrays 280a~280h, and write drivers for writing data to the first through eighth bank arrays 280a~280h.

Data to be read from one bank array of the first through eighth bank arrays 280a~280h may be sensed by a sense amplifier coupled to the one bank array from which the data is to be read, and may be stored in the read data latches. The data stored in the read data latches may be provided to the memory controller 15 via the data I/O buffer 295. Data DQ to be written in one bank array of the first through eighth bank arrays 280a~280h may be provided to the data I/O buffer 295 from the memory controller 15. The write driver may write the data DQ in one bank array of the first through eighth bank arrays 280a~280h.

The control logic 210 may control operations of the memory device 201. For example, the control logic 210 may generate control signals for the memory device 201 in order to perform a write operation or a read operation. The control logic 210 may include a command decoder 211 that decodes a command CMD received from the memory controller 15 via the buffer chip 150 and a mode register 212 that sets an operation mode of the memory device 201.

For example, the command decoder 211 may generate the control signals corresponding to the command CMD by decoding a write enable signal (/WE), a row address strobe signal (/RAS), a column address strobe signal (/CAS), a chip select signal (/CS), etc.

Figure 9:
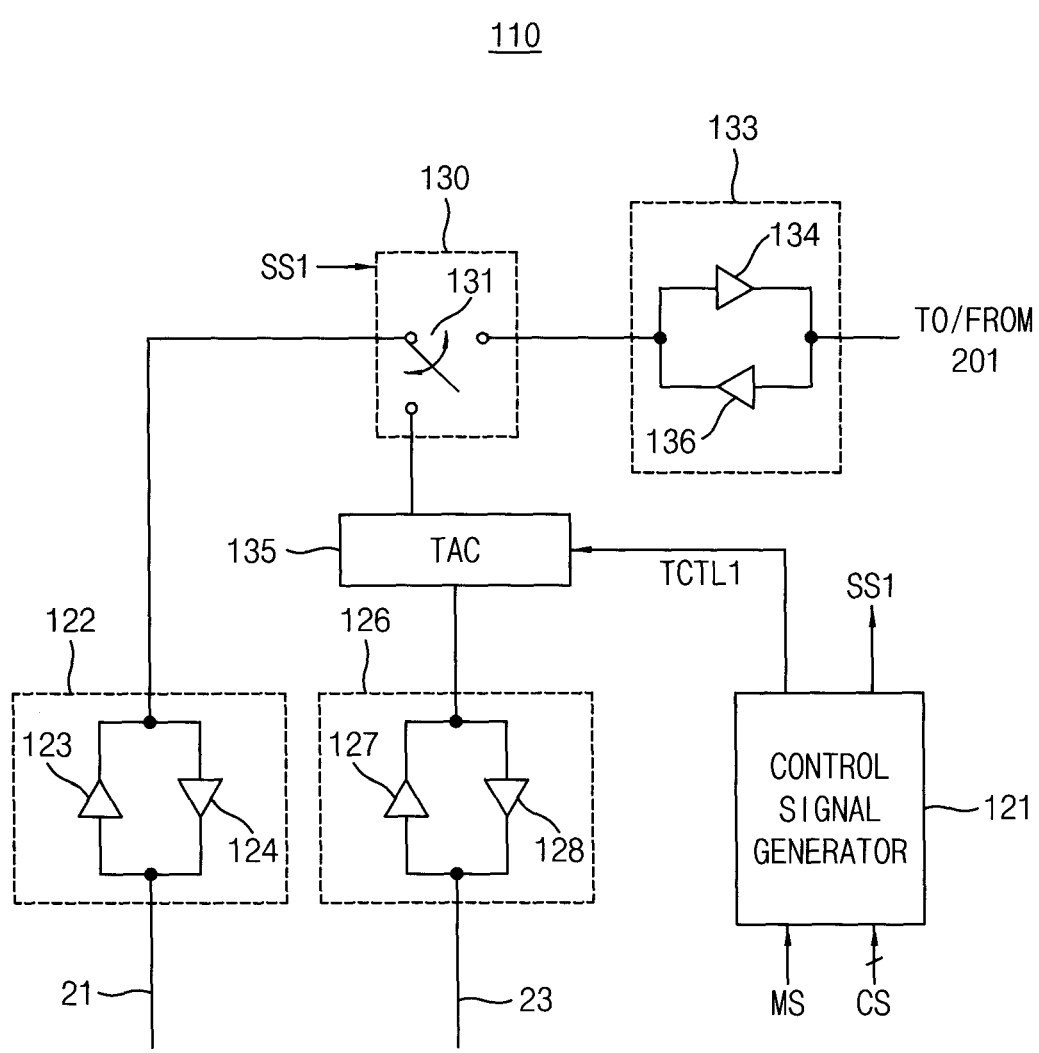
FIG. 9 illustrates an example of the data buffer chip in the first memory module of FIG. 3 according to example embodiments.

FIG. 9 illustrates an example of the data buffer chip in the first memory module of FIG. 3 according to example embodiments.

Referring to FIG. 9, the data buffer chip 110 may be an integrated circuit device that includes a control signal generator 121, a first buffer circuit 122, a second buffer circuit 126, a path selection circuit 130, a third buffer circuit 133 and a timing adjusting circuit 135.

The control signal generator 121 may generate a selection signal SS1 and a timing control signal TCTL1 based on a mode signal MS and the chip selection signal CS. The mode signal MS and the chip selection signal CS may be included in the first control signal CTL1. The control signal generator 121 may provide the selection signal SS1 to the path selection signal 130 and may provide the timing control signal TCTL1 to the timing adjusting circuit 135. The mode signal MS may indicate one of a write mode and a read mode.

The first buffer circuit 122 may include buffers 123 and 124 and may be coupled to the memory controller 15 through the first data bus 21. The second buffer circuit 126 may include buffers 127 and 128 and may be coupled to the second through k-th memory modules 300a~500a through the second data bus 23. The third buffer circuit 133 may include buffers 134 and 136 and may be coupled to the first memory devices 201~208 through the transmission line TL2.

The path selection circuit 130 may include a switch 131 and may selectively connect the first buffer circuit 122 to one of the third buffer circuit 133 and the timing adjusting circuit 135 in response to the selection signal SS1. For example, when the first memory module 100a is selected by the chip selection signal CS, the path selection circuit 130 may connect the first buffer circuit 122 to the third buffer circuit 133 in response to the selection signal SS1. Therefore, the write data DQ from the memory controller 15 may be stored in the memory devices 201~208 as the first data, or the read data from the memory devices 201~208 may be transmitted to the memory controller 15 as the first data.

For example, when one of the second through k-th memory modules 300a~500a is selected by the chip selection signal CS, the path selection circuit 130 may connect the first buffer circuit 122 to the timing adjusting circuit 135 in response to the selection signal SS1. The timing adjusting circuit 135 may adjust transmission timing of the data DQ from the memory controller 15 to provide the second data to the second buffer circuit 126, or may adjust transmission timing of the second data from the second buffer circuit 126 to provide the second data to the first buffer circuit 122, based on the timing control signal TCTL1. Therefore, the data DQ as the second data from the memory controller 15 may be stored in memory devices in one of the second through k-th memory modules 300a~500a, or the read data as the second data from the memory devices in one of the second through k-th memory modules 300a~500a may be transmitted to the memory controller 15. In this manner, the data are forwarded, or re-routed, using the buffer device 110 to one of the memory modules (e.g., 300~500, 300a~500a, etc.).

Figure 10:
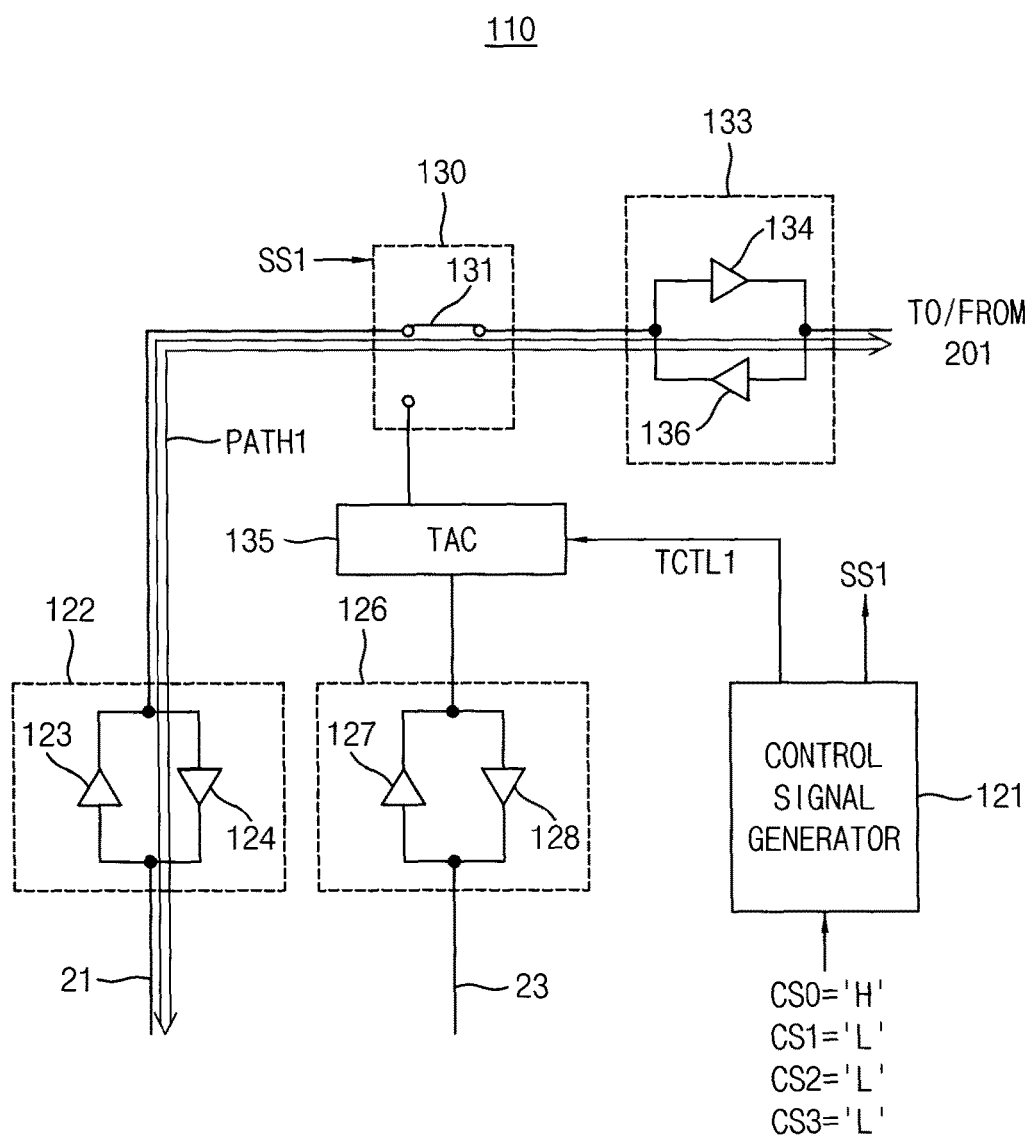
FIGS. 10 and 11 respectively illustrate that the path selection circuit selects a path in response to the chip selection signal in the data buffer circuit of FIG. 9, according to example embodiments.
Figure 11:
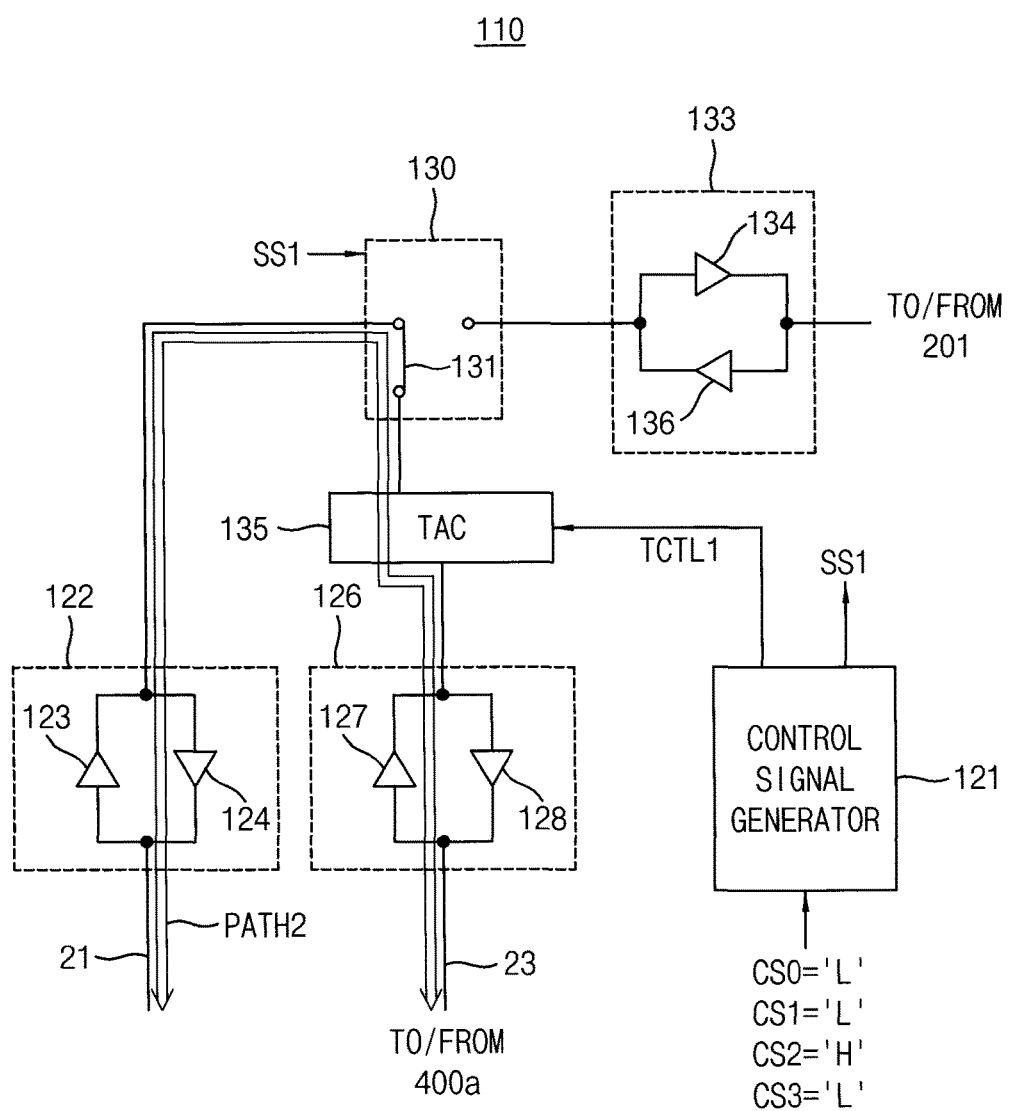

FIGS. 10 and 11 respectively illustrate that the path selection circuit selects a path in response to the chip selection signal in the data buffer circuit of FIG. 9.

In FIGS. 10 and 11, it is assumed that k corresponds to 4.

Referring to FIG. 10, when the chip selection signals CS0~CS3 respectively correspond to 'H', 'L', 'L', and 'L', and thus the first memory module 100a is selected, the chip selection circuit 130 connects the first buffer circuit 122 to the third buffer circuit 133 in response to the selection signal SS1. In this case, the second through k-th memory modules 300a~500a are disabled in response to the chip selection signals CS1~CS3. Therefore, one memory device 201 of the memory devices 201~208 in the first memory module 100a and the memory controller 15 may exchange the data DQ via a first path PATH1.

Referring to FIG. 11, when the chip selection signals CS0~CS3 respectively correspond to 'L', 'L', 'H', 'L', and thus the third memory module 400a is selected, the chip selection circuit 130 connects the first buffer circuit 122 to the timing adjusting circuit 135 in response to the selection signal SS1. In this case, the second and fourth memory modules 300a and 500a are disabled in response to the chip selection signals CS1 and CS3. Therefore, one memory device of the memory devices in the third memory module 400a and the memory controller 15 may exchange the data DQ via a second path PATH2. Given that they are selecting modules, the chip selection signals described in this manner may also be referred to herein as module selection signals.

Figure 12:
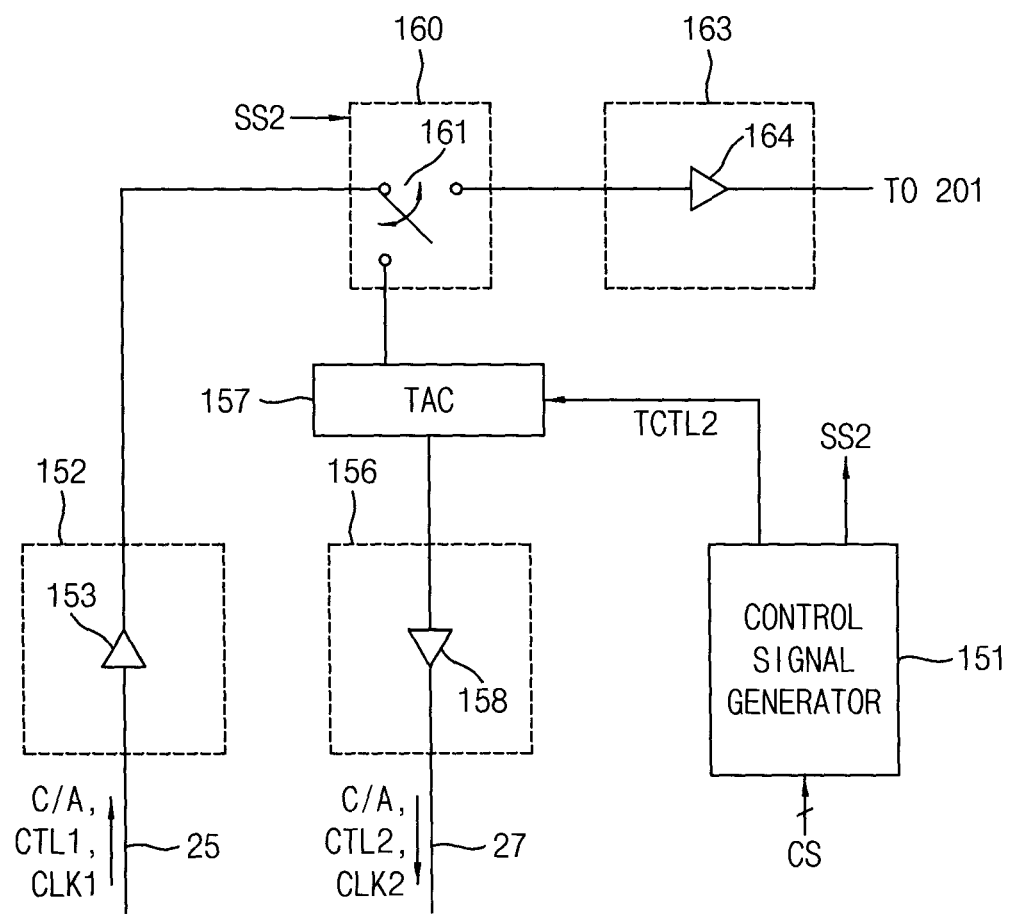
FIG. 12 is a block diagram illustrating an example of the buffer chip in the first memory module of FIG. 3 according to example embodiments.

FIG. 12 is a block diagram illustrating an example of the buffer chip in the first memory module of FIG. 3 according to example embodiments.

Referring to FIG. 12, the buffer chip 150 may include a control signal generator 151, a first buffer circuit 152, a second buffer circuit 156, a path selection circuit 160, a third buffer circuit 163 and a timing adjusting circuit 157.

The control signal generator 151 may generate a selection signal SS2 and a timing control signal TCTL2 based on the chip selection signal CS. The control signal generator 151 may provide the selection signal SS2 to the path selection circuit 160 and may provide the timing control signal TCTL2 to the timing adjusting circuit 157.

The first buffer circuit 152 may include a buffer 153 and may be coupled to the memory controller 15 through the first control bus 25. The second buffer circuit 156 may include a buffer 158 and may be coupled to the second through k-th memory modules 300a~500a through the second control bus 27. The third buffer circuit 164 may include a buffer 164 and may be coupled to the first memory devices 201~208 through the transmission line TL1.

The path selection circuit 160 may include a switch 161 and may selectively connect the first buffer circuit 152 to one of the third buffer circuit 163 and the timing adjusting circuit 157 in response to the selection signal SS2. For example, when the first memory module 100a is selected by the chip selection signal CS, the path selection circuit 160 may connect the first buffer circuit 152 to the third buffer circuit 163 in response to the selection signal SS2. Therefore, the command/address C/A, the first control signal CTL1 and the first clock signal CLK1 from the memory controller 15 may be provided to the memory devices 201~208.

As another example, when one of the second through k-th memory modules 300a~500a is selected by the chip selection signal CS, the path selection circuit 160 may connect the first buffer circuit 152 to the timing adjusting circuit 157 in response to the selection signal SS2. The timing adjusting circuit 157 may adjust timing of at least one of the command/address C/A, the first control signal CTL1 and the first clock signal CLK1 from the memory controller 15 to provide the command/address C/A, the second control signal CTL2 and the second clock signal CLK2 to the second buffer circuit 156. The second buffer circuit 156 may re-drive the command/address C/A, the second control signal CTL2 and the second clock signal CLK2 to one of the second through k-th memory modules 300a~500a. As such, these address, clock, and command/control signals may be forwarded to the second through k-th memory modules 300a~500a.

In certain embodiments, the timing adjusting circuit 157 may increase latency in the first control signal CTL1 or may decrease a frequency of the first clock signal CLK1 to provide the second buffer circuit 157 with the adjusted first control signal CTL1 and the adjusted first clock signal CLK1 in response to the timing control signal TCTL2. For example, the timing adjusting circuit 157 may adjust the latency in the first control signal CTL1 and the frequency of the first clock signal CLK1 based on the timing control signal TCTL2 such that the adjusted latency and the adjusted frequency match operating timing of the memory devices in one of the second through k-th memory modules 300a~500a. For adjusting the frequency, the timing adjusting circuit 157 may include a delay-locked loop (DLL) circuit or a phase-locked loop circuit that decreases a frequency of the first clock signal CLK1 to provide the second clock signal CLK2. For adjusting latency, the timing adjusting circuit 157 may include a latency control circuit that increases the latency in the first control signal CTL1.

Figure 13:
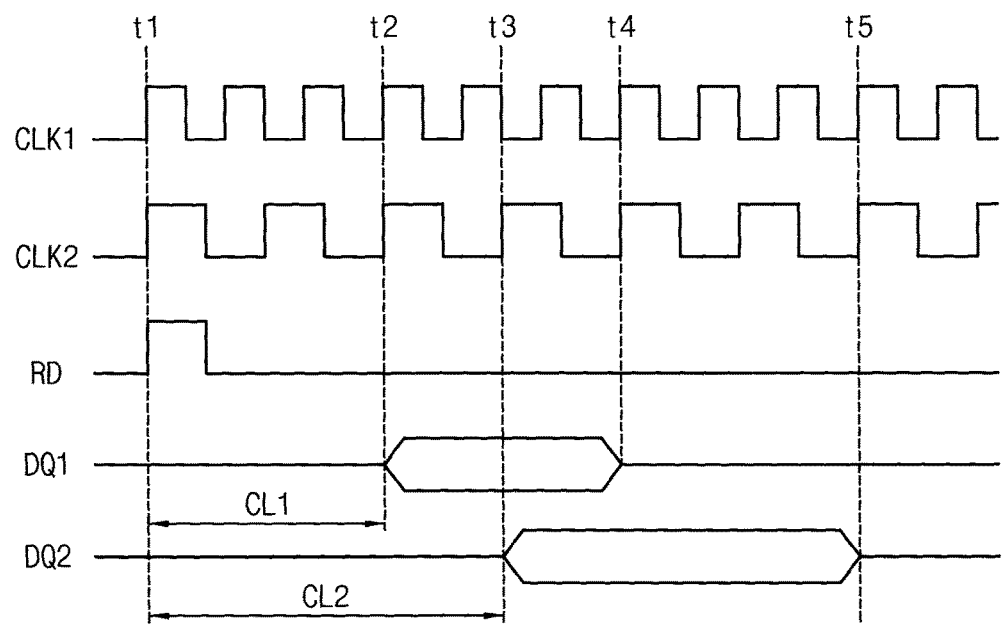
FIG. 13 illustrates that the control signal and the clock signal in the buffer chip of FIG. 12 are adjusted, according to example embodiments.

FIG. 13 illustrates that the control signal and the clock signal in the buffer chip of FIG. 12 are adjusted, according to one exemplary embodiment.

Referring to FIGS. 12 and 13, the first clock signal CLK1 from the memory controller 15 has a first frequency, the second clock signal CLK2 output from the timing adjusting circuit 157 has a second frequency and the first frequency is higher than the second frequency.

One of the memory devices 201~208 receives a read command RD at a time t1, and begins to perform a read operation. For example, a chip on one of the memory devices 201~208 begins to output read data DQ1 at a time t2, which is three cycles of the first clock signal CLK1 after time t1. The chip continues to output the read data DQ1 until a time t4, which is three cycles of the first clock signal CLK1 after time t2. One of the memory chips in selected one of the second through k-th memory modules 300a~500a receives the read command RD at time t1, and begins to perform a read operation. One of the memory chips in selected one of the second through k-th memory modules 300a~500a begins to output read data DQ2 at a time t3, which is three cycles of the second clock signal CLK2 after time t1.

One of the memory chips in selected one of the second through k-th memory modules 300a~500a continues to output the read data DQ2 until a time t5, which is three cycles of the second clock signal CLK2 after time t3. A column address strobe (CAS) latency in the first memory module 100a corresponds to a first CAS latency CL1 and a CAS latency in the selected one of the second through k-th memory modules 300a~500a corresponds to a second CAS latency CL2.

Figure 14:
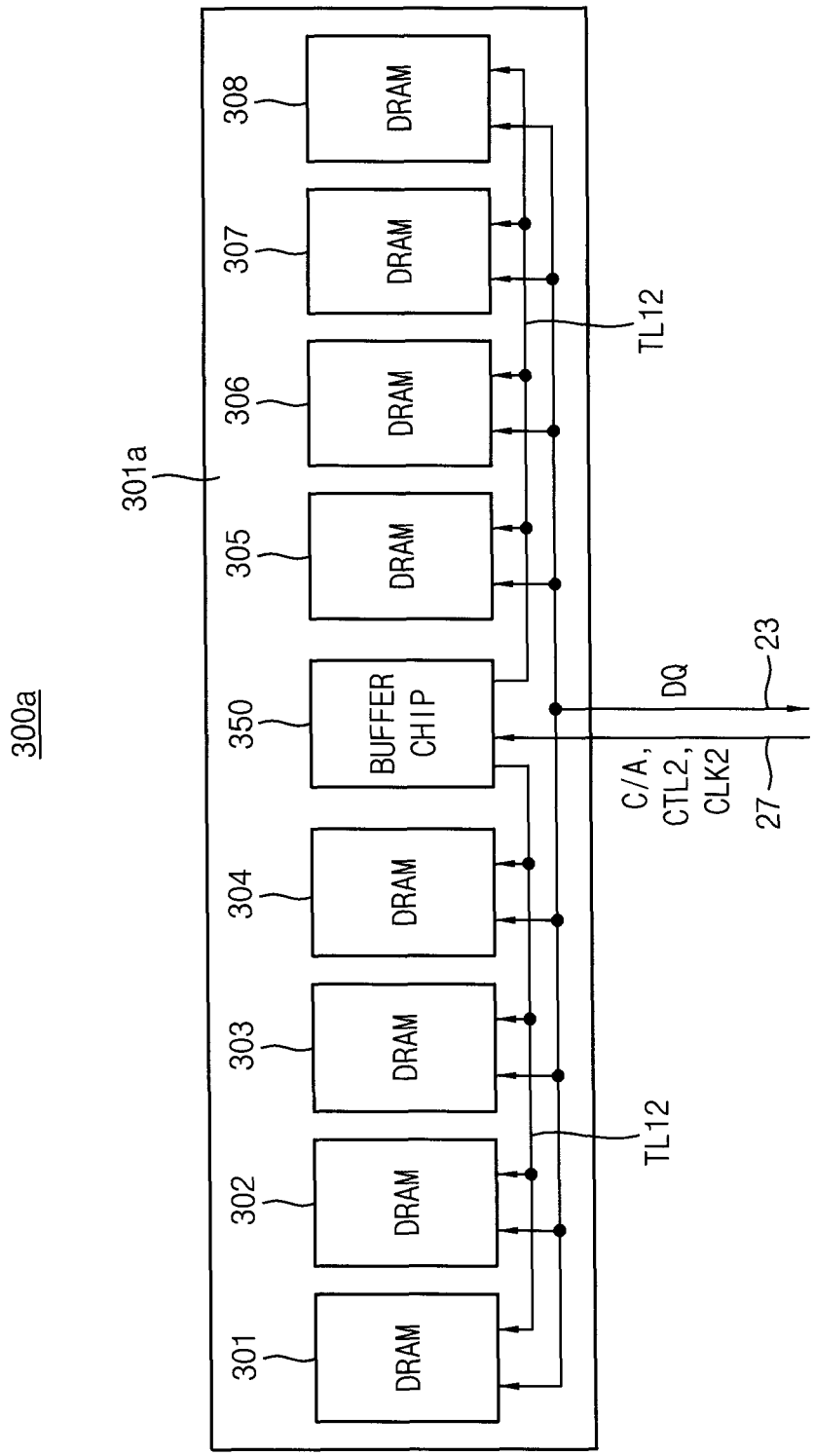
FIG. 14 is a block diagram illustrating an example of the second memory module in FIG. 2A according to example embodiments.

FIG. 14 is a block diagram illustrating an example of the second memory module in FIG. 2A according to example embodiments.

In FIG. 14, there is illustrated an example of the second memory module 300a, each of the third through k-th memory modules 400a and 500a may substantially have a same configuration as a configuration of the second memory module 300a. Thus, these memory modules may have the same configuration-type, and also may have the same memory cell type.

Referring to FIG. 14, the second memory module 300a may be implemented with an LRDIMM. The second memory module 300a may include a plurality of memory devices 301~308 mounted on a module board 301a, and a buffer chip 350.

Each of the memory devices 301~308 may include one or more memory chips (e.g., formed in a package), and may store the data DQ as the second data therein using data transmission lines, which is re-driven from the first memory module 100a through the second data bus 23 in a write mode, or may transmit data therefrom through the second data bus 23 to the memory controller 15 via the first memory module 100a in a read mode. In one embodiment, each of the memory devices 201~208 may be a DDR4 SDRAM or a DDR3 SDRAM.

The buffer chip 350 may receive the command/address C/A, the second control signal CTL2 and the second clock signal CLK2 re-driven from the first memory module 100a through the second control bus 27 and may provide the memory devices 301~308 with the command/address C/A, the second control signal CTL2 and the second clock signal CLK2 through a transmission line TL12.

Figure 15:
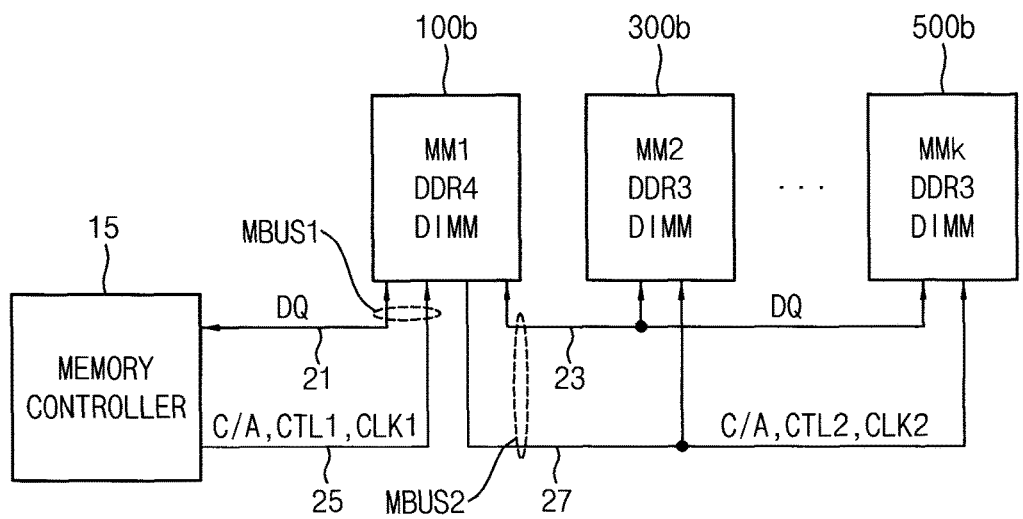
FIG. 15 illustrates an example of the memory system of FIG. 1 according to example embodiments.

FIG. 15 illustrates an example of the memory system of FIG. 1 according to example embodiments.

Referring to FIG. 15, a memory system 10b may include a memory controller 15 and a plurality of memory modules 100b and 300b~500b.

A first memory module 100b of the memory modules 100b and 300b~500b may be implemented with a DDR4 dual in-line memory module (DIMM) and each of the second through k-th memory modules 300b~500b may be implemented with a DDR3 DIMM. As such, a plurality of first memory devices mounted on the first memory module 100b may be a DDR4 SDRAM and a plurality of first memory devices mounted on each of the second through k-th memory modules 300b~500b may be a DDR3 SDRAM. Therefore, an operating speed of each first memory device may be faster than an operating speed of each second memory device. In addition, a latency of each first memory device may be smaller than latency of each second memory device. As such, the first memory module 100b may have a different configuration-type as the second through k-th memory modules 300b~500b, even though all of the modules may have the same memory cell type.

The memory controller 15 may be directly coupled to the first memory module 100b through a first memory bus MBUS1. The first memory module 100b may be coupled to the memory controller 15 with a point-to-point connection. The second through k-th memory modules 300b~500b may be coupled to the first memory module 100a through a second memory bus MBUS2 with a multi-drop connection, and thus may be connected indirectly to the memory controller 15 through the first memory module 100*a*. Therefore, the memory system 10*b* may increase operating speed without decreasing storage capacity because the operating speed of memory controller 15 may be limited by a load of the first memory module 100*b* directly coupled to the memory controller 15 rather than by load of the first to k-th memory modules.

The first memory module 100*b*, in response to a chip selection signal, may store the data from the memory controller 15 in the first memory chips or may re-drive the data from the memory controller 15 to second through k-th memory modules 300*b*~500*b*.

Figure 16:
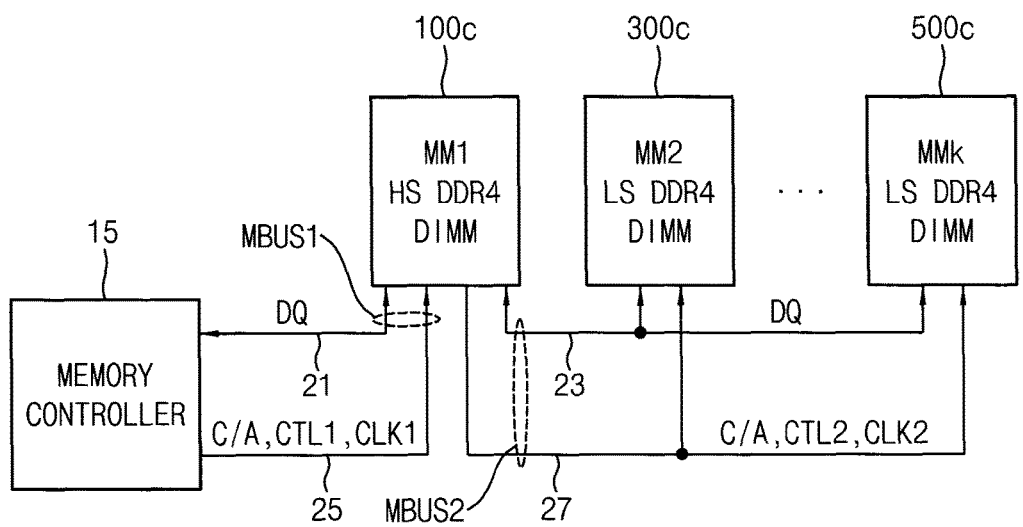
FIG. 16 illustrates another example of the memory system of FIG. 1 according to example embodiments.

FIG. 16 illustrates another example of the memory system of FIG. 1 according to example embodiments.

Referring to FIG. 16, a memory system 10*c* may include a memory controller 15 and a plurality of memory modules 100*c* and 300*c*~500*c*.

A first memory module 100*c* of the memory modules 100*c* and 300*c*~500*c* may be implemented with a high-speed DDR4 DIMM and each of the second through k-th memory modules 300*c*~500*c* may be implemented with low-speed DDR4 DIMM. Thus, a plurality of first memory devices including first memory chips mounted on the first memory module 100*c* may be a high-speed DDR4 SDRAM, and a plurality of second memory devices including second memory chips mounted on each of the second through k-th memory modules 300*c*~500*c* may be a low-speed DDR4 SDRAM (e.g., having a slower clock speed than the high-speed DDR4 SDRAM). Therefore, operating speed of each first memory chip may be faster than operating speed of each second memory chip. In addition, a latency of each first memory chip may be smaller than latency of each second memory chip. As such, the first memory module 100*c* may have a different configuration-type as the second through k-th memory modules 300*c*~500*c*, even though all of the modules may have the same memory cell type.

The memory controller 15 may be directly coupled to the first memory module 100*c* through a first memory bus MBUS1. The first memory module 100*c* may be coupled to the memory controller 15 with a point-to-point connection. The second through k-th memory modules 300*c*~500*c* may be coupled to the first memory module 100*a* through a second memory bus MBUS2 with a multi-drop connection. Therefore, the memory system 10*c* may increase operating speed without decreasing storage capacity because the operating speed of the memory controller 15 may be limited by a load of the first memory module 100*c* directly coupled to the memory controller 15 rather than by load of first to k-th memory modules.

The first memory module 100*c*, in response to a chip selection signal, may store the data from the memory controller 15 in the first memory chips or may re-drive the data from the memory controller 15 to second through k-th memory modules 300*c*~500*c*.

Figure 17:
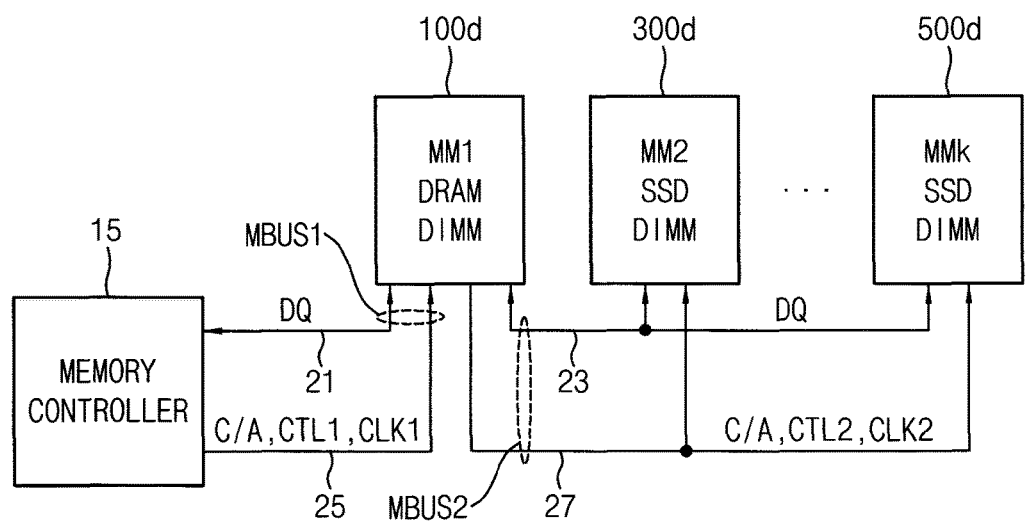
FIG. 17 illustrates still another example of the memory system of FIG. 1 according to example embodiments.

FIG. 17 illustrates still another example of the memory system of FIG. 1 according to example embodiments.

Referring to FIG. 17, a memory system 10*d* may include a memory controller 15 and a plurality of memory modules 100*d* and 300*d*~500*d*.

A first memory module 100*d* of the memory modules 100*d* and 300*d*~500*d* may be implemented with a DRAM DIMM based on DRAMs and each of the second through k-th memory modules 300*d*~500*d* may be implemented with a solid-state disk (SSD) DIMM based on SSDs. Thus, a plurality of first memory devices each including one or more first memory chips mounted on the first memory module 100*d* may be a DRAM and a plurality of second memory devices each including one or more second memory chips mounted on each of the second through k-th memory modules 300*b*~500*b* may be a nonvolatile memory device. As such, the memory system 10*d* may be a hybrid memory system including a volatile memory module and nonvolatile memory modules. Therefore, an operating speed of each first memory chip may be faster than an operating speed of each second memory chip. In addition, a latency of each first memory chip may be smaller than latency of each second memory chip. As such, the first memory module 100*d* may have a different configuration-type and different memory cell type as the second through k-th memory modules 300*c*~500*c*.

The memory controller 15 may be directly coupled to the first memory module 100*d* through a first memory bus MBUS1. The first memory module 100*d* may be coupled to the memory controller 15 with a point-to-point connection. The second through k-th memory modules 300*d*~500*d* may be coupled to the first memory module 100*d* through a second memory bus MBUS2 with a multi-drop connection. Therefore, the memory system 10*d* may increase operating speed without decreasing storage capacity because the operating speed of the memory controller 15 may be limited by a load of the first memory module 100*d* directly coupled to the memory controller 15 rather than by load of first to k-th memory modules.

The first memory module 100*d*, in response to a chip selection signal, may store the data from the memory controller 15 in the first memory devices or may re-drive the data from the memory controller 15 to second through k-th memory modules 300*d*~500*d*.

Figure 18:
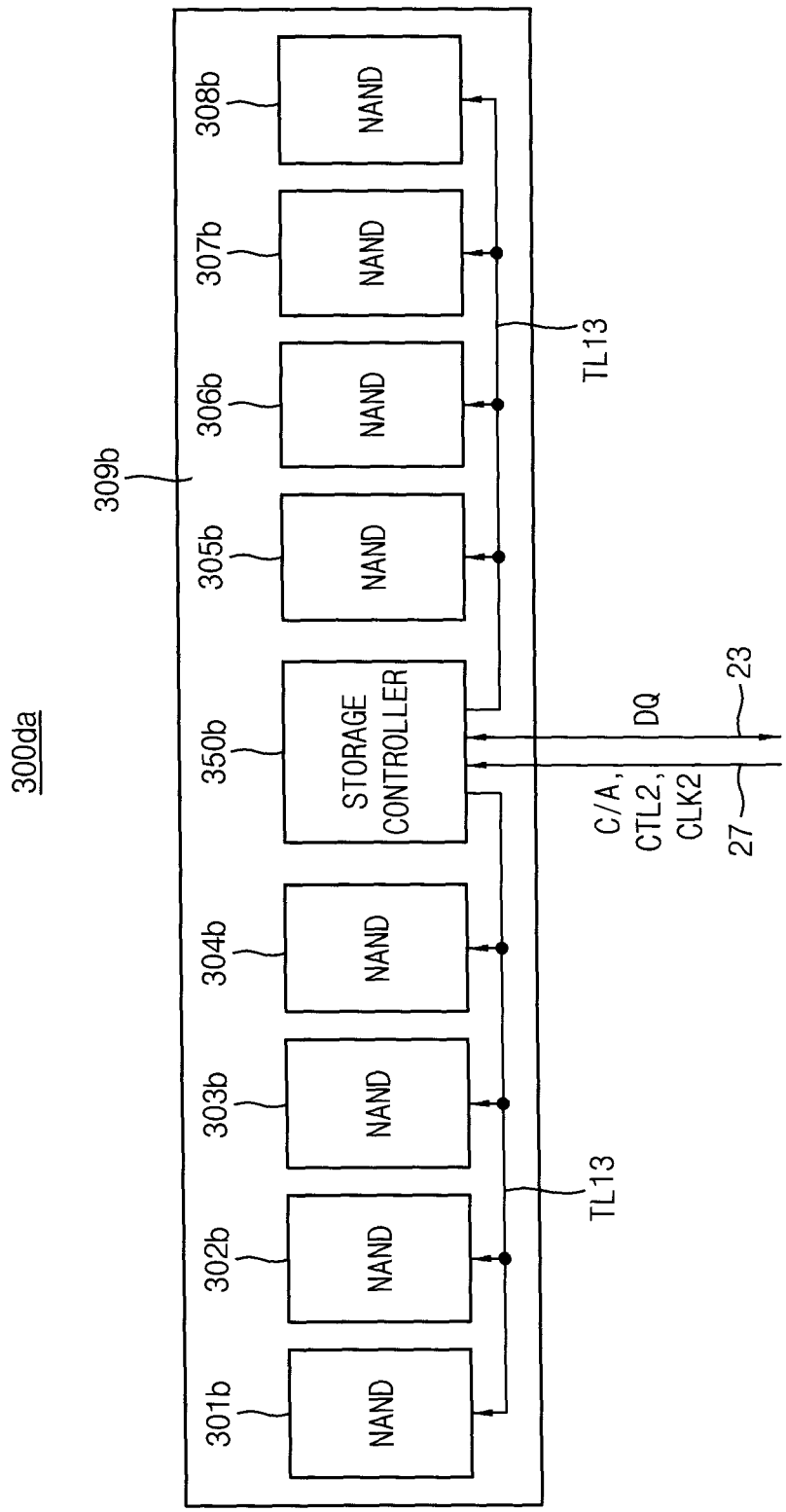
FIG. 18 is a block diagram illustrating an example of the second memory module in FIG. 17 according to example embodiments.

FIG. 18 is a block diagram illustrating an example of the second memory module in FIG. 17 according to example embodiments.

In FIG. 18, there is illustrated an example of the second memory module 300*d*, each of the third through k-th memory modules 400*d* and 500*d* may substantially have a same configuration as a configuration of the second memory module 300*d*.

Referring to FIG. 18, a second memory module 300*da* may be implemented with an SSD DIMM. The second memory module 300*da* may include a plurality of nonvolatile memory devices 301*b*~308*b* mounted on a module board 309*b* and a storage controller 350*b* that controls the nonvolatile memory devices 301*b*~308*b*. Each of the nonvolatile memory devices 301*b*~308*b* may be an NAND flash memory device, for example, including one or more NAND flash memory chips formed in a package.

The storage controller 350*b* may be coupled to the second data bus 23 and the second control bus 27. The storage controller stores the data DQ as the second data in the nonvolatile memory devices 301*b*~308*b* using transmission lines TL13, which data DQ is re-driven from the first memory module 100*d* through the second data bus 23 in a write mode, or may transmit data from the nonvolatile memory devices 301*b*~308*b* to the memory controller 15 via the first memory module 100*d* in a read mode according to the command/address C/A, the second control signal CTL2 and the second clock signal CLK2 re-driven from the first memory module 100*d* through the second control bus 27.

The storage controller 350*b* may be coupled to the nonvolatile memory devices 301*b*~308*b* through the transmission lines TL13.

Figure 19:
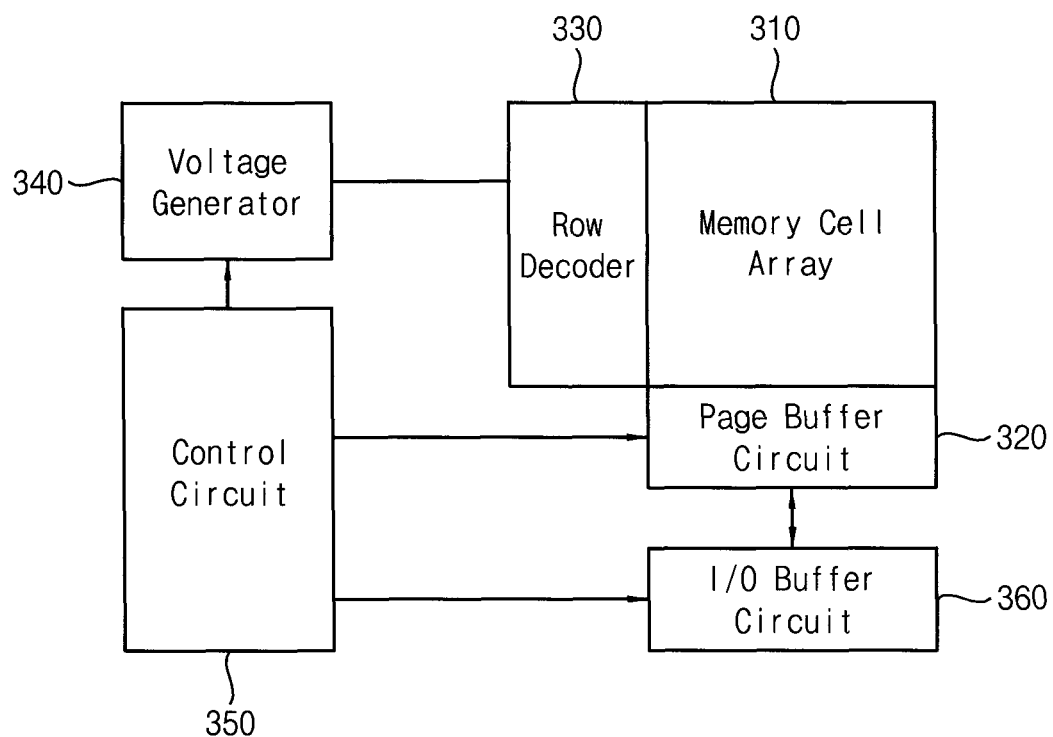
FIG. 19 is a block diagram illustrating one of the non-volatile memory chips in FIG. 18 according to example embodiments.

FIG. 19 is a block diagram illustrating one of the nonvolatile memory devices in FIG. 18 according to example embodiments.

Referring to FIG. 19, the nonvolatile memory device 301b may include a nonvolatile memory chip, which may include a memory cell array 310, a page buffer circuit 320, a row decoder 330, a voltage generator 340, a control circuit 350 and an input/output (I/O) buffer circuit 360. The nonvolatile memory device 301b may be implemented by flash memory device. For example, the nonvolatile memory device 301b may be implemented by PRAM, FRAM, RRAM, MRAM, etc.

The memory cell array 310 includes a plurality of memory cells connected to a plurality of word lines and a plurality of bit lines. As will be described below with reference to FIGS. 18 and 19, each of the memory cells may include a NAND flash memory cell. The memory cells may be arranged in a two-dimensional array structure or a three-dimensional array structure.

In example embodiments, each of the memory cells may include a single level memory cell (SLC) for storing one data bit and a multi-level memory cell (MLC) for storing a plurality data bits. In a case of the MLC, a program scheme in a write mode may include various program schemes such as a shadow program scheme, a reprogram scheme, or an on-chip buffered program scheme.

The page buffer circuit 320 is connected to the bit-lines and is controlled by the control circuit 350 and serves as a sense amplifier or a write driver according an operation mode. For example, during a read operation, the page buffer circuit 320 operates as the sense amplifier for sensing data from memory cells in a selected row. During a program operation, the page buffer circuit 320 may operate as a write driver for driving memory cells in a selected row according to program data.

The I/O buffer circuit 360 may receive write data re-driven from the first memory module 100d and may transmit read data from the memory cell array 310 to the memory controller 15 via the first memory module 100d.

The row decoder 330 is connected to the word-lines and may select at least one of the word-lines in response to a row address. The voltage generator 340 may generate word-line voltages such as a program voltage, a pass voltage, a verification voltage, an erase voltage and a read-out voltage according to a control of the control circuit 350. The control circuit 350 may control the page buffer circuit 320, the row decoder 430 and the voltage generator 340 and the I/O buffer circuit 360.

In some embodiments, a three dimensional (3D) memory array is provided in the memory cell array 310. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The 3D memory array includes vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 20:
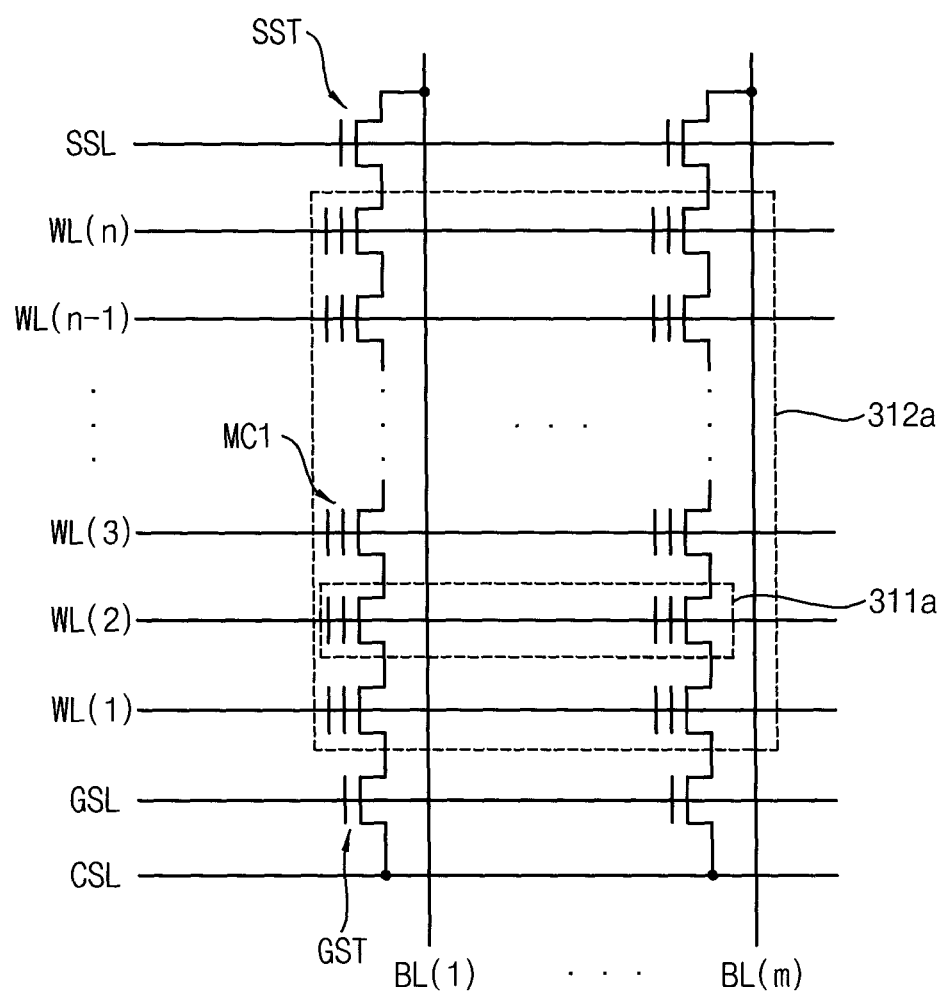
FIGS. 20 and 21 are diagrams illustrating examples of memory cell arrays that might be incorporated in the non-volatile memory device of FIG. 19, according to example embodiments.
Figure 21:
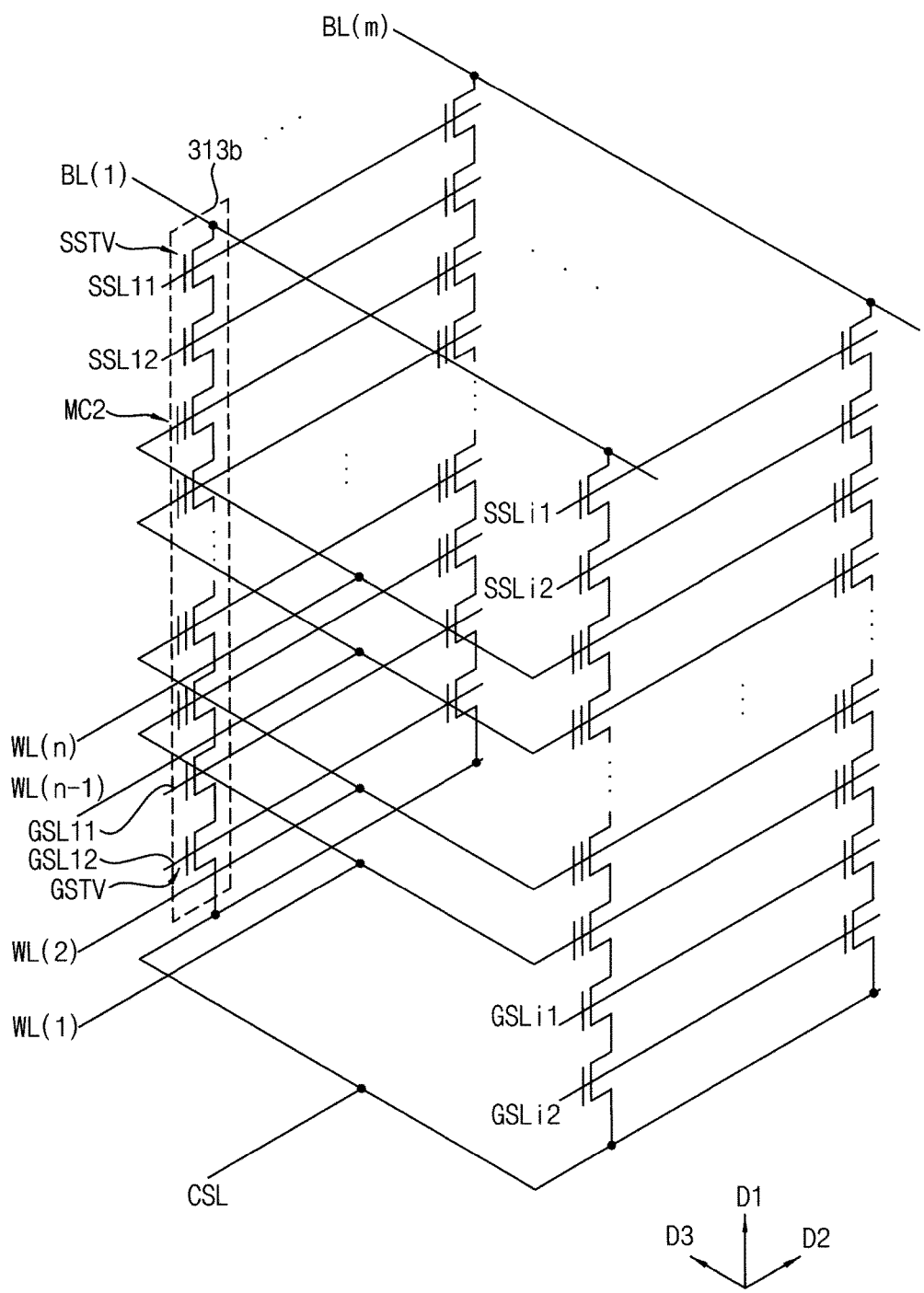

FIGS. 20 and 21 are diagrams illustrating examples of memory cell arrays that could be incorporated in the nonvolatile memory device of FIG. 19.

Referring to FIG. 20, a memory cell array 310a may include string select transistors SST, ground select transistors GST and a plurality of memory cells MC1. The string select transistors SST may be connected to bit-lines BL(1), . . . , BL(m), and the ground select transistors GST may be connected to a common source line CSL. The memory cells MC2 may be connected in series between the string select transistors SST and the ground select transistors GST. Memory cells in the same row may be connected to the same word-line among word-lines WL(1), . . . , WL(n). For example, 16, 32 or 64 word-lines may be disposed between a string select line SSL and a ground select line GSL.

The string select transistors SST may be connected to the string select line SSL, and may be controlled by a voltage on the string select line SSL. The ground select transistors GST may be connected to the ground select line GSL, and may be controlled by a voltage on the ground select line GSL. The memory cells MC2 may be controlled by a voltage on the word-lines WL(1), . . . , WL(n).

In the NAND flash memory device including the memory cell array 310a, a read operation and a program operation may be performed per page 311a, and an erase operation may be performed per block 312a. In this case, the odd-numbered bit-lines may form odd-numbered pages, the even-numbered bit-lines may form even-numbered pages, and program operations for the odd-numbered pages and the even-numbered pages may be alternately performed.

Referring to FIG. 21, a memory cell array 310b may include a plurality of strings 313b each of which has a vertical structure. The plurality of strings 313b may be formed in a second direction D2 to define a string column, and a plurality of string columns may be formed in a third direction D3 to define a string array. Each string may include string select transistors SSTV, ground select transistors GSTV, and a plurality of memory cells MC2 that are formed in a first direction D1 and are connected in series between the string select transistors SSTV and the ground select transistors GSTV.

The string select transistors SSTV may be connected to bit-lines BL(1), . . . , BL(m), and the ground select transistors GST may be connected to a common source line CSL. The string select transistors SSTV may be connected to string select lines SSL11, SSL12, . . . , SSLi1, SSLi2, and the ground select transistors GSTV may be connected to ground select lines GSL11, GSL12, . . . , GSLi1, GSLi2. The memory cells in the same layer may be connected to the same word-line among word-lines WL(1), WL(2), . . . WL(n−1), WL(n). Each string select line and each ground select line may extend in the second direction D2, and the string select lines SSL11, . . . , SSLi2 and the ground select lines GSL11, . . . , GSLi2 may be formed in the third direction D3. Each word-line may extend in the second direction D2, and the word-lines WL(1), . . . , WL(n) may be formed in the first direction D1 and the third direction D3. Each bit-line may extend in the third direction D3, and the bit-lines BL(1), . . . , BL(m) may be formed in the second direction D2. The memory cells MC2 may be controlled by a voltage on the word-lines WL(1), . . . , WL(n).

Similarly to the NAND flash memory device, in the vertical flash memory device including the memory cell array 310b, a read operation and a program operation may be performed per page, and an erase operation may be performed per block.

Although not illustrated in FIG. 21, according to embodiments, two string select transistors included in a single string may be connected to a single string select line, and two ground select transistors included in the single string may be connected to a single ground select line. According to embodiments, the single string may include one string select transistor and one ground select transistor.

Figure 22:
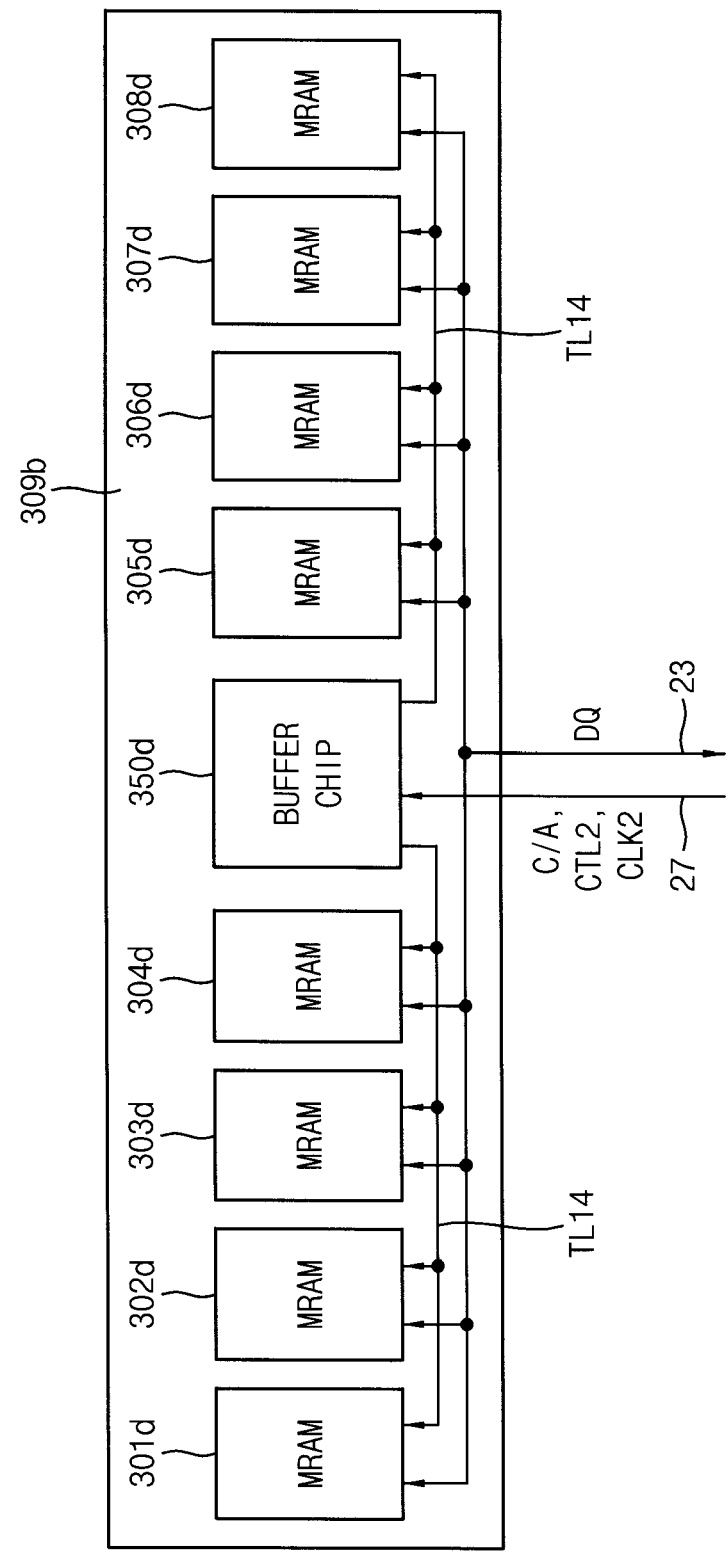
FIG. 22 is a block diagram illustrating another example of the second memory module in FIG. 17 according to example embodiments.

FIG. 22 is a block diagram illustrating another example of the second memory module in FIG. 17 according to example embodiments.

In FIG. 22, there is illustrated an example of the second memory module 300d, each of the third through k-th memory modules 400d and 500d may substantially have a same configuration as a configuration of the second memory module 300d.

Referring to FIG. 22, a second memory module 300db may be implemented with an SSD DIMM. The second memory module 300db may include a plurality of magnetic memory devices 301d~308d, each including one or more magnetic memory chips, mounted on a module board 309b and a buffer chip 350d. Each of the magnetic memory devices 301d~308d may be an MRAM.

Each of the magnetic memory devices 301d~308d may store the data DQ as the second data therein using data transmission lines, which is re-driven from the first memory module 100d through the second data bus 23 in a write mode, or may transmit data therefrom through the second data bus 23 to the memory controller 15 via the first memory module 100d in a read mode.

The buffer chip 350d may receive the command/address C/A, the second control signal CTL2 and the second clock signal CLK2 re-driven from the first memory module 100d through the second control bus 27 and may provide the magnetic memory devices 301d~308d with the command/address C/A, the second control signal CTL2 and the second clock signal CLK2 through a transmission line TL14.

The buffer chip 350d may be coupled to the magnetic memory devices 301d~308d through the transmission lines TL14.

Figure 23:
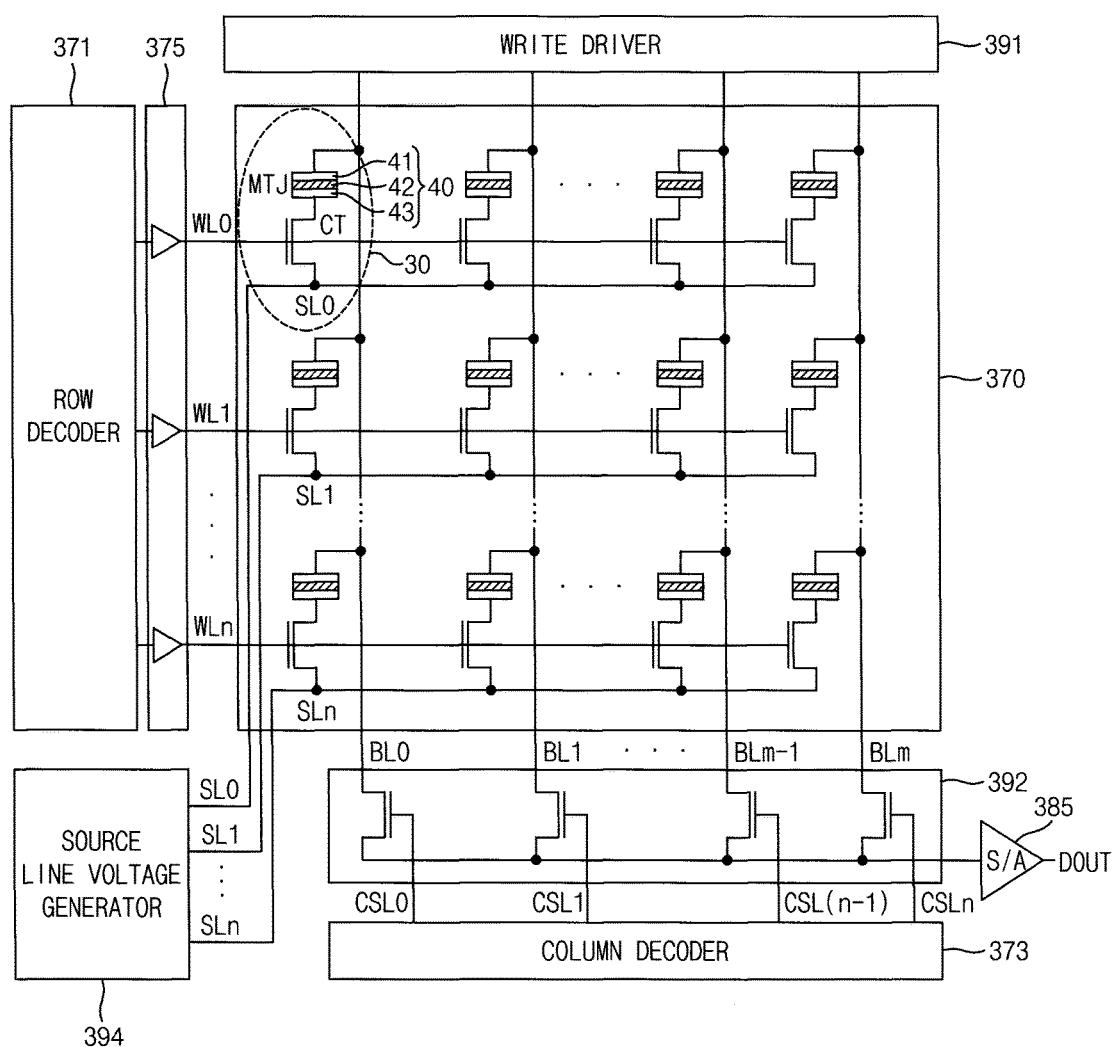
FIG. 23 is a block diagram illustrating one of the magnetic memory devices in FIG. 22 according to example embodiments.

FIG. 23 is a block diagram illustrating one of the magnetic memory chips in FIG. 22 according to example embodiments.

In FIG. 23, there will be description on a bank array, a portion of a memory cell array of the magnetic memory chip 301d.

Referring to FIG. 23, the magnetic memory chip 301d may include a bank array 370, a row decoder 371, a word-line driver 375, a write driver 391, a source line voltage generator 394, a column selection circuit 392, a column decoder 373 and a sense amplifier 385.

The bank array 370 may include a plurality of word-lines WL0 through WLn (where n is a natural number equal to or greater than 1), a plurality of bit-lines BL0 through BLm (where m is a natural number equal to or greater than 1), a plurality of source lines SL0 through SLn, and a plurality of magnetic memory cells 30 disposed at intersections between the word-lines WL0 through WLn and the bit-lines BL0 through BLm. Each of the magnetic memory cells 30 may be a spin torque transfer (STT)-MRAM cell. The magnetic memory cell 30 may include a magnetic tunnel junction (MTJ) element 40 having a magnetic material.

Each of the magnetic memory cells 30 may include a cell transistor CT and the MTJ element 40. In one memory cell 30, a drain (a first electrode) of the cell transistor CT may be connected to a pinned layer 43 of the MTJ element 40. A free layer 41 of the MTJ 40 may be connected to the bit-line BL0, and a source (a second electrode) of the cell transistor CT may be connected to the source line SL0. A gate of the cell transistor CT may be connected to the word line WL0.

The MTJ element 40 may be replaced by a resistive device such as a phase change random access memory (PRAM) using a phase change material, a resistive random access memory (RRAM) using a variable resistive material such as a complex metal oxide, or a magnetic random access memory (MRAM) using a ferromagnetic material. Materials forming the resistive devices have resistance values that vary according to a size and/or a direction of a current or a voltage, and are nonvolatile and thus may maintain the resistance values even when the current or the voltage is cut off.

The word-line WL0 may be enabled by a row decoder 371, and may be connected to a word line driver 375 that drives a word-line selection voltage. The word-line selection voltage activates the word-line WL0 in order to read or write a logic state of the MTJ element 40.

The source line SL0 is connected to the source line voltage generator 394. The source line voltage generator 394 may receive and decode an address signal and a read/write signal, and may generate a source line selection signal in the selected source line SL0. A ground reference voltage may be supplied to the unselected source lines SL1 through SLn.

The bit-line BL0 is connected to a column select circuit 392 that is driven by column selection signals CSL0 through CSLm. The column selection signals CSL0 through CSLm are selected by a column decoder 373. For example, the selected column selection signal CSL0 turns on a column select transistor in the column selection circuit 292, and selects the bit-line BL0. A logic state of the MTJ element 40 is read from the bit-line BL0 through the sense amplifier 385. Alternatively, a write current applied through the write driver 391 is transmitted to the selected bit-line BL0 and is written to the MTJ element 40.

Figure 24:
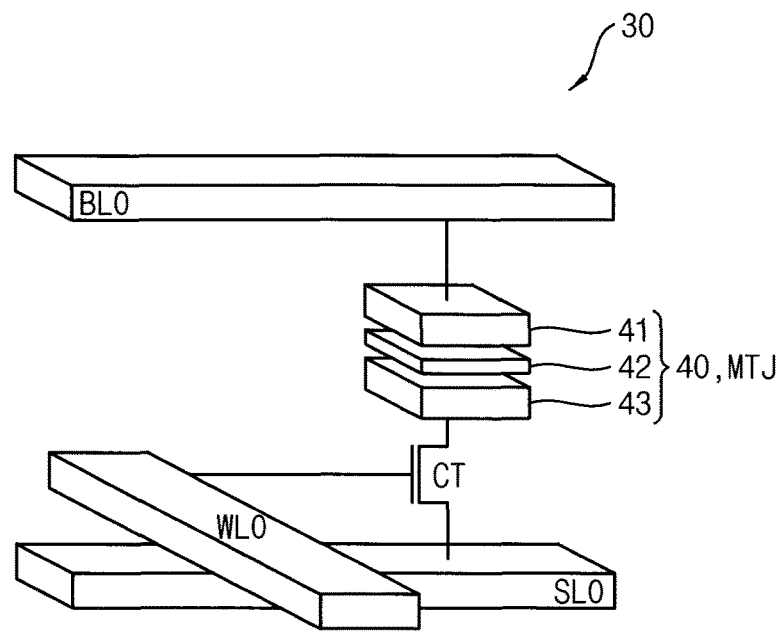
FIG. 24 is a diagram illustrating an example of a spin-transfer torque magneto-resistive random access memory (STT-MRAM) cell in the memory cell array of FIG. 23.

FIG. 24 is a diagram illustrating an example of a spin-transfer torque magneto-resistive random access memory (STT-MRAM) cell in the memory cell array of FIG. 23.

Referring to FIG. 24, the STT-MRAM cell 30 may include the MTJ element 40 and a cell transistor CT. A gate of the cell transistor CT is coupled to a corresponding word line WL0, a first electrode of the cell transistor CT is coupled to a corresponding bit line BL0 via the MTJ element 40, and a second electrode of the cell transistor CT is coupled to the source line SL0.

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word-line WL0 to turn on the cell transistor CT. A program current, that is, a write current is applied to the bit-line BL0 and the source line SL0. A direction of the write current is determined by a logic state of the MTJ element 40.

In order to perform a read operation of the STT-MRAM cell 30, a logic high voltage is applied to the word-line WL0 to turn on the cell transistor CT, and a read current is supplied to the bit-line BL0 and the source line SL0. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 25A:
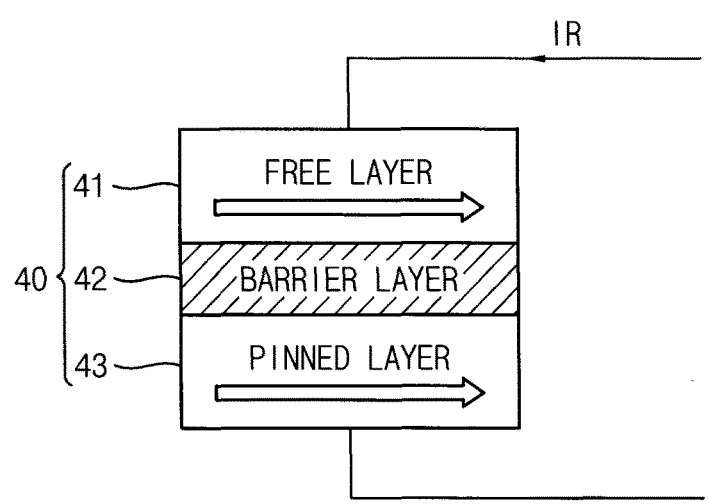
FIGS. 25A and 25B are block diagrams for explaining a magnetization direction according to data written to the MTJ element of FIG. 24, according to example embodiments.
Figure 25B:
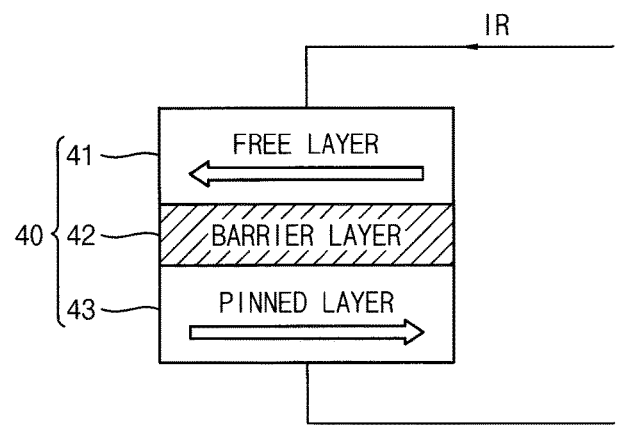

FIGS. 25A and 25B are block diagrams for explaining a magnetization direction according to data written to the MTJ element of FIG. 24.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 25A, a magnetization direction of the free layer 41 and a magnetization direction of the pinned layer 43 of the MTJ element 40 are parallel. Accordingly, the MTJ element 40 may have a high resistance value. In this case, the MTJ element 40 may read data '0'.

Referring to FIG. 25B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ element 40 are horizontal magnetic layers, the present inventive concept is not limited thereto and the free layer 41 and the pinned layer 43 may be, for example, vertical magnetic layers.

Figure 26:
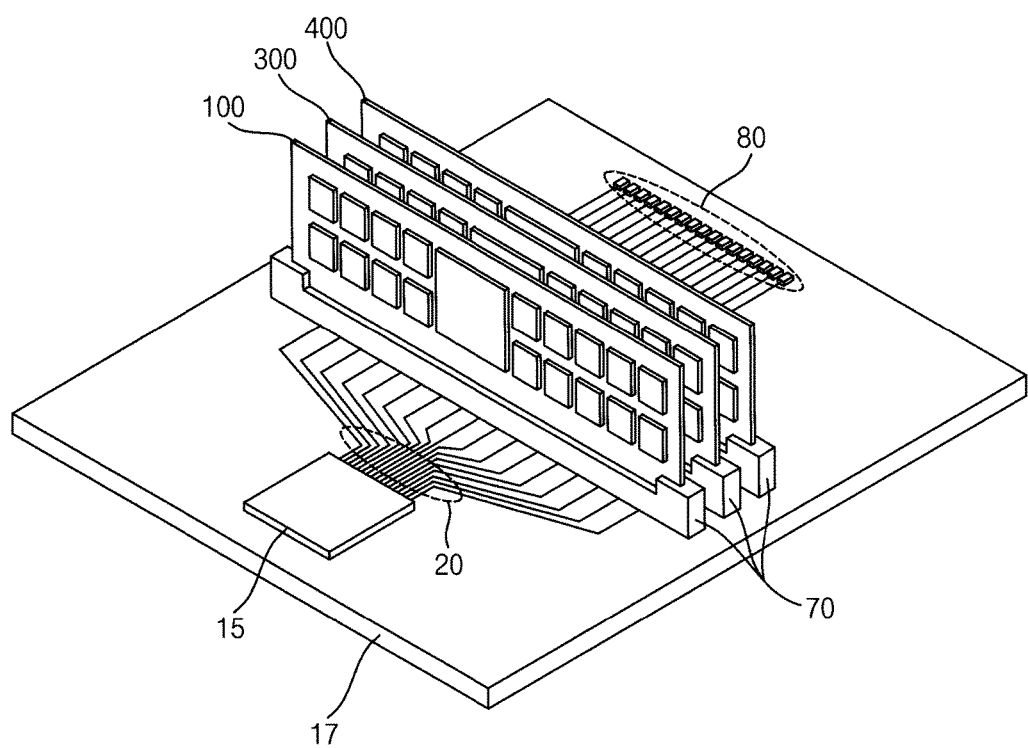
FIG. 26 illustrates that memory modules are connected to a memory controller according to example embodiments.

FIG. 26 illustrates that memory modules are connected to a memory controller according to example embodiments.

Referring to FIG. 26, the memory controller 15 and a plurality of connecting sockets 70 mounted on a main board 17 are electrically connected via a system bus 20. In each of the connecting sockets 70, a desired number of the memory modules 100, 300 and 400 illustrated in FIG. 1 may be included. In each of the connecting sockets 70, the memory modules 100, 300 and 400 according to the previous embodiments may further be included. Termination resistors 80 may be disposed on the main board 17 for impedance matching, like on the module boards in the previous embodiments. The system bus 20 may connect directly between the controller 15 and the first memory module 100, and the second memory module 300 and third memory module 400 may connect to the first memory module 100 through a different bus (not shown) in a multi-drop configuration. As such, the second memory module 300 and third memory module 400 may connect to the controller 15 indirectly through the first memory module 100. As described above, in certain embodiments, the first memory module 100 may have a different configuration-type, which may or may not include a different memory cell type, from the second and third memory modules 300 and 400.

Figure 27:
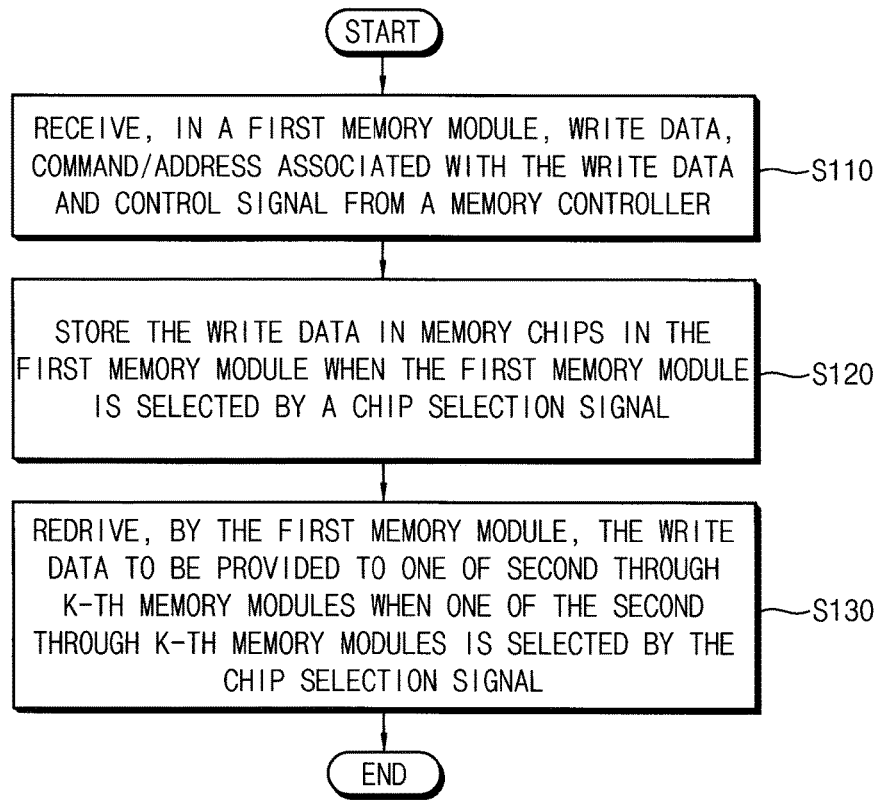
FIG. 27 a flow chart illustrating a method of operating a memory system according to example embodiments.

FIG. 27 is a flow chart illustrating a method of operating a memory system according to example embodiments.

Referring to FIGS. 1 through 27, in a method of operating a memory system including a memory controller 15, a first memory module 100 directly coupled to the memory controller 15 through a first memory bus MBUS1 and second through k-th memory modules 300~500 coupled to the first memory module 100 through a second memory bus MBUS2, the first memory module 100 receives a write data DQ and a command/address C/A and a first control signal CTL1 associated with the write data DQ from the memory controller 15 (S110). When the first memory module is selected by a chip selection signal in the first control signal CTL1, the write data DQ is stored in memory chips of memory devices 201~208 mounted on the first memory module (S120). When at least one of the second through k-th memory modules 300~500 is selected by the chip selection signal, the first memory module 100 re-drives (e.g., forwards) the write data DQ to the selected one of the second through k-th memory modules 300~500 (S130). In one embodiment, the re-driving may use a different clock frequency to support a different configuration-type memory module, for example, where the first memory module 100 is a different configuration-type from the second through k-th memory modules 300~500.

Figure 28:
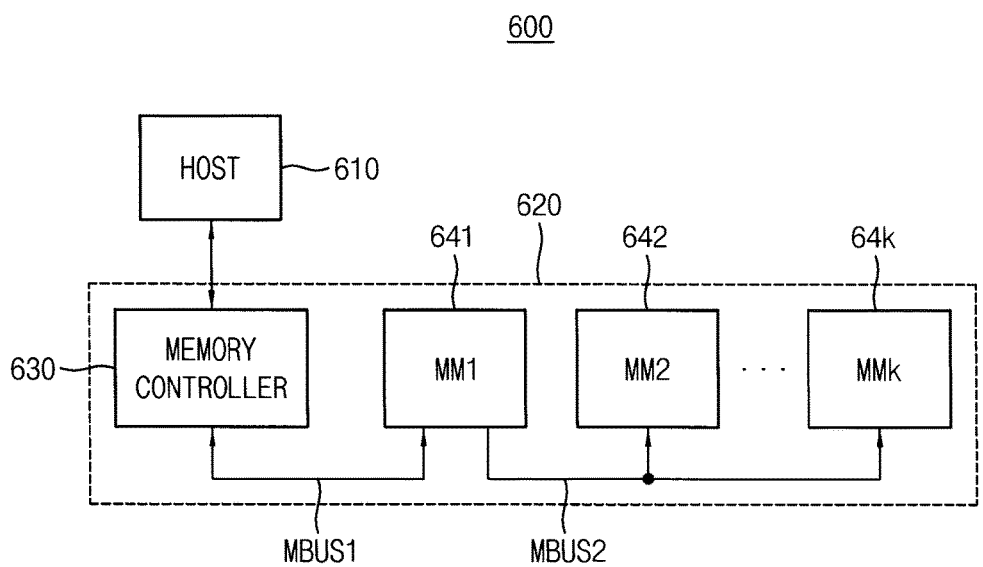
FIG. 28 is a block diagram illustrating an electronic system according to example embodiments.

FIG. 28 is a block diagram illustrating an electronic system according to example embodiments.

Referring to FIG. 28, an electronic system 600 may include a host 610 and a memory system 620. The memory system 620 may include a memory controller 630 and a plurality of memory modules 641~64$k$.

The host 610 may communicate with the memory system 620 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 610 may also communicate with the memory system 620 through interface protocols such as Universal Serial Bus (USB), Multi-Media Card (MMC), Enhanced Small Disk Interface (ESDI), or Integrated Drive Electronics (IDE).

The memory controller 630 may control an overall operation of the memory system 620. The memory controller 630 may control an overall data exchange between the host 610 and the plurality of memory modules 641~64$k$. For example, the memory controller 620 may write data in the plurality of memory modules 641~64$k$ or read data from the plurality of memory modules 641~64$k$ in response to request from the host 610.

The first memory module 641 may be directly coupled to the memory controller 630 through a first memory bus MBUS1. The first memory module 641 may be coupled to the memory controller 630 with a point-to-point connection. The second through k-th memory modules 642~64$k$ may be coupled to the first memory module 641 through a second memory bus MBUS2 with a multi-drop connection. The first memory module 641 may include a plurality of first memory devices, each including one or more chips operating at a first, high speed and each of the second through k-th memory modules 642~64$k$ may include a plurality of second memory devices, each including one or more chips operating at a second, low speed, compared to the higher speed of the high speed first memory devices. Therefore, the electronic system 600 may increase operating speed without decreasing storage capacity because the operating speed of memory controller 630 may be limited by a load of the first memory module 641 directly coupled to the memory controller 630 rather than by load of the first to k-th memory modules.

Figure 29:
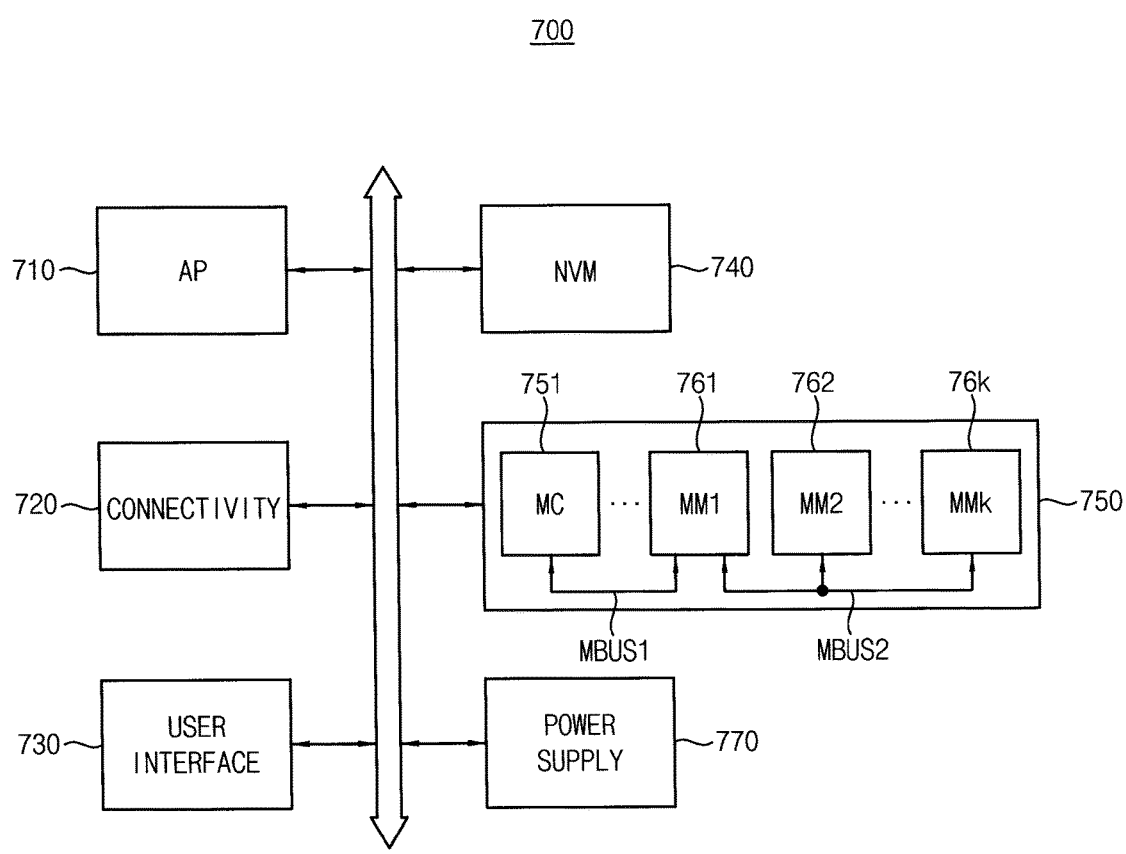
FIG. 29 is a block diagram illustrating a mobile device including the memory module according to example embodiments.

FIG. 29 is a block diagram illustrating a mobile device including the memory module according to example embodiments.

Referring to FIG. 29, an electronic device such as a mobile device 700 may include an application processor 710, a connectivity unit 720, a user interface 730, a non-volatile memory device 740, a memory system 750, and a power supply 770. In some embodiments, the mobile device 700 may be a mobile phone, a smart phone, a personal digital assistant (PDA), a portable multimedia player (PMP), a digital camera, a music player, a portable game console, a navigation system, etc.

The application processor 710 may execute applications, such as a web browser, a game application, a video player, etc. In some embodiments, the application processor 710 may include a single core or multiple cores. For example, the application processor 710 may be a multi-core processor, such as a dual-core processor, a quad-core processor, a hexa-core processor, etc. The application processor 710 may include an internal or external cache memory.

The connectivity unit 720 may perform wired or wireless communication with an external device. For example, the connectivity unit 720 may perform Ethernet communication, near field communication (NFC), radio frequency identification (RFID) communication, mobile telecommunication, memory card communication, universal serial bus (USB) communication, etc. In some embodiments, the connectivity unit 720 may include a baseband chipset that supports communications, such as global system for mobile communications (GSM), general packet radio service (GPRS), wideband code division multiple access (WCDMA), high speed downlink/uplink packet access (HSxPA), etc.

The memory system 750 may store data processed by the application processor 710 or operate as a working memory. The memory system 750 may include a memory controller 751 and a plurality of memory modules 761~76k. The first memory module 761 may be directly coupled to the memory controller 751 through a first memory bus MBUS1. The first memory module 761 may be coupled to the memory controller 751 with a point-to-point connection. The second through k-th memory modules 762~76k may be coupled to the first memory module 761 through a second memory bus MBUS2 with a multi-drop connection. The first memory module 761 may include a plurality of first memory devices operating at a first, high speed and each of the second through k-th memory modules 762~76k may include a plurality of second memory devices operating at a second, low speed (e.g., lower than the high speed). Therefore, the memory system 750 may increase operating speed without decreasing storage capacity because the operating speed of memory controller 751 may be limited by a load of the first memory module 761 directly coupled to the memory controller 751 rather than by load of the first to k-th memory modules.

The nonvolatile memory device 740 may store a boot image for booting the mobile system 700. For example, the nonvolatile memory device 740 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 730 may include at least one input device, such as a keypad, a touch screen, etc., and at least one output device, such as a speaker, a display device, etc. The power supply 770 may supply a power supply voltage to the mobile device 700. In some embodiments, the mobile device 700 may further include a camera image processor (CIS), and/or a storage device, such as a memory card, a solid state drive (SSD), a hard disk drive (HDD), a CD-ROM, etc.

In some embodiments, components of the mobile device 700, such as the memory devices on the memory modules 761, and 762 through 76k, may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 30:
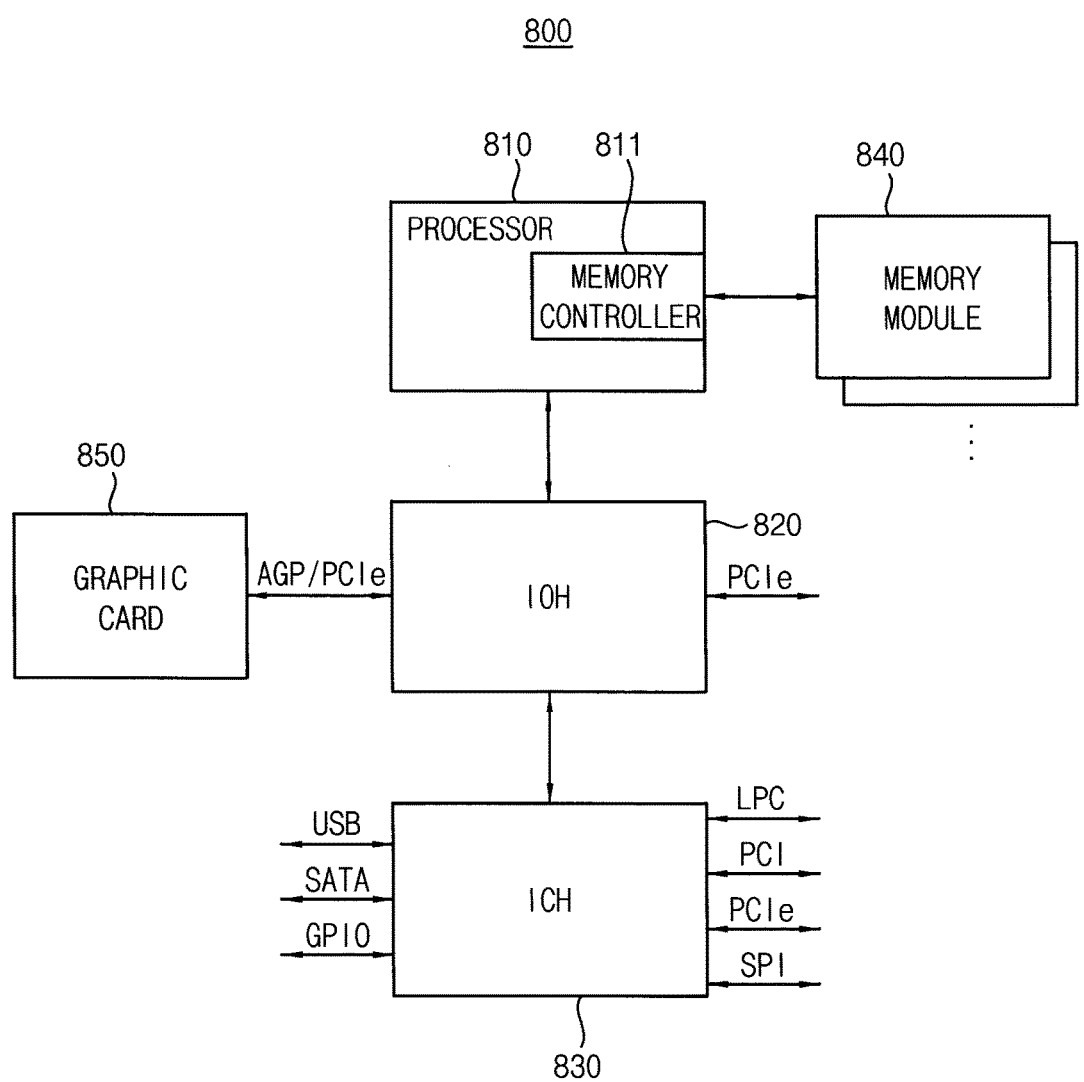
FIG. 30 is a block diagram illustrating a computing system including the memory module according to example embodiments.

FIG. 30 is a block diagram illustrating a computing system including the memory module according to example embodiments.

Referring to FIG. 30, an electronic device such as a computing system 800 may include a processor 810, an input/output hub (IOH) 820, an input/output controller hub (ICH) 830, a plurality of memory modules 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. Although FIG. 30 illustrates the computing system 800 including one processor 810, in some embodiments, the computing system 800 may include a plurality of processors. The processor 810 may include an internal or external cache memory.

The processor 810 may include a controller 811 for controlling operations of the memory modules 840. The controller 811 included in the processor 810 may be referred to as an integrated memory controller (IMC). An interface between the controller 811 and the memory modules 840 may be implemented with a single channel including a plurality of signal lines, or may be implemented with multiple channels, to each of which memory modules 840 may be coupled. In some embodiments, the controller 811 may be located inside the input/output hub 820, which may be referred to as a memory controller hub (MCH).

The memory modules 840 may include a plurality of memory modules that store data provided from the controller 811. For example, the memory modules 840 may include a first memory module and second through k-th memory modules described with reference to FIGS. 2 through 26. The first memory module may be directly coupled the memory controller 811 with point-to-point connection and the second through k-th memory modules may be coupled to the first memory module with a multi-drop connection. Therefore, the computing system 800 may increase operating speed without decreasing storage capacity because the operating speed of the memory controller 811 may be limited by a load of the first memory module directly coupled to the memory controller 811 rather than by load of the first to k-th memory modules.

The input/output hub 820 may manage data transfer between the processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a Quick-Path interconnect (QPI), a common system interface (CSI), etc. Although FIG. 30 illustrates the computing system 800 including one input/output hub 820, in some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not shown) for displaying an image. The graphics card 850 may include an internal processor for processing image data and an internal semiconductor memory device. In some embodiments, the input/output hub 820 may include an internal graphics device along with or instead of the graphics card 850 outside the input/output hub 820. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration in order to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller 830 may be implemented as a single chipset.

The example embodiments are applicable to various systems, such as a personal computer, a workstation, a tablet computer, a mobile phone, a smart phone, a PDA, a PMP, a digital camera, a digital television, a set-top box, a music player, a portable game console, a navigation system, etc.

The foregoing is illustrative of embodiments and is not to be construed as limiting thereof. Although a few embodiments have been described, those skilled in the art will readily appreciate that many modifications are possible in the embodiments without materially departing from the scope of the present disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the claims.

What is claimed is:

1. A memory system comprising:
   a memory controller;
   a first memory module directly coupled to the memory controller without any other memory modules communicatively connected therebetween, through a first memory bus, the first memory module configured to exchange first data with the memory controller; and
   second through k-th memory modules coupled to the first memory module with a multi-drop connection through a second memory bus, the second through k-th memory modules configured to exchange second data with the memory controller via the first memory module, k being a natural number greater than two.

2. The memory system of claim 1, wherein the first memory module is configured to operate in a first mode in which the first memory module re-drives data from the memory controller to one of the second through k-th memory modules, and
   wherein the second through k-th memory modules are configured to operate in a second mode in which the second through k-th memory modules receive the re-driven data.

3. The memory system of claim 1, wherein the first memory module is also configured to operate in a second mode in which the first memory module receives data from the memory controller and stores the data in a memory device of the first memory module.

4. The memory system of claim 1, wherein the first memory module is a load-reduced dual in-line memory module (LRDIMM) and each of the second through k-th memory modules is a registered dual in-line memory module (RDIMM).

5. The memory system of claim 1, wherein the first memory module comprises:
   a plurality of first memory devices;
   a buffer device configured to, in response to a chip selection signal,
   (1) select between:
       providing a command/address, a first control signal, and a first clock signal to the first memory devices, and
       re-driving the command/address, a second control signal and a second clock signal to at least one of the second through k-th memory modules; and
   (2) select between:
       providing data from the memory controller to at least one of the first memory devices as the first data, and
       re-driving the data from the memory controller to at least one of the second through k-th memory modules as the second data.

6. The memory system of claim 5, wherein the buffer device includes a data buffer chip commonly coupled to the first memory devices.

7. The memory system of claim 5, wherein the buffer device includes:
   a first buffer circuit coupled to the memory controller through a first data bus of the first memory bus;
   a second buffer circuit coupled to the second through k-th memory modules through a second data bus of the second memory bus;
   a third buffer circuit coupled to the first memory devices;
   a timing adjusting circuit coupled to the second buffer circuit; and
   a path selection circuit configured to selectively connect the first buffer circuit to one of the third buffer circuit and the timing adjusting circuit, based on a selection signal.

8. The memory system of claim 7, further comprising:
   a control signal generator configured to generate the selection signal and a timing control signal in response to the chip selection signal and a mode signal included in the first control signal,
   wherein the control signal generator provides the selection signal to the path selection circuit and provides the timing control signal to the timing adjusting circuit, and wherein when the path selection circuit connects the first buffer circuit to the timing adjusting circuit in response to the selection signal, the timing adjusting circuit delays transmission timing of the data from the memory controller based on the timing control signal and re-drives the data as the second data to an activated memory module of the second through k-th memory module, in response to the chip selection signal via the second buffer circuit.

9. The memory system of claim 7, further comprising:
a control signal generator configured to generate the selection signal and a timing control signal in response to the chip selection signal,
wherein the control signal generator provides the selection signal to the path selection circuit and provides the timing control signal to the timing adjusting circuit.

10. The memory system of claim 5, wherein each of the second through k-th memory modules comprises:
a plurality of second memory devices; and
a buffer device configured to provide the second memory devices with the command/address, the second control signal, and the second clock signal, in response the chip selection signal.

11. The memory system of claim 10, wherein each of the first memory devices is a dynamic random access memory (DRAM) operating with a first clock frequency, each of the second memory devices is a DRAM operating with a second clock frequency, and the first clock frequency is higher than the second clock frequency.

12. The memory system of claim 1, wherein the first memory module is a dynamic random access memory (DRAM) module including DRAM devices and each of the second through k-th memory modules is a solid state disk (SSD) module including SSD devices.

13. A memory system comprising:
a memory controller;
a first memory module directly coupled to the memory controller with a point-to-point connection through a first memory bus, the first memory module configured to exchange first data with the memory controller, the first memory module including a plurality of first memory devices; and
second through k-th memory modules coupled to the first memory module with a multi-drop connection through a second memory bus, the second through k-th memory modules configured to exchange second data with the memory controller via the first memory module, each of the second through k-th memory modules including a plurality of second memory devices, k being a natural number greater than two,
wherein the first memory module has a re-driving mode in which the first memory module re-drives data received from the memory controller to one of the second through k-th memory modules.

14. The memory system of claim 13, wherein the first memory module has a different configuration-type from the second through k-th memory modules.

15. The memory system of claim 14, wherein the first memory module is a load-reduced dual in-line memory module (LRDIMM) and each of the second through k-th memory modules is a registered dual in-line memory module (RDIMM).

16. The memory system of claim 14, wherein the first memory module further comprises:
a first buffer device, configured to, in response to a chip selection signal,
either provide a command/address, a first control signal, and a first clock signal to at least one of the first memory devices,
or adjust timings of at least one of the command/address, the first control signal, and the first clock signal to re-drive the command/address, a second control signal, and a second clock signal to at least one of the second through k-th memory modules; and
either provide data from the memory controller to at least one of the first memory devices as the first data,
or re-drive the data from the memory controller to at least one of the second through k-th memory modules as the second data.

17. The memory system of claim 14, wherein
each of the first memory devices is a dynamic random access memory (DRAM) operating with a first clock frequency and having a first latency,
each of the second memory devices is a DRAM operating with a second clock frequency and having a second latency,
the first clock frequency is higher than the second clock frequency, and
the first latency is smaller than the second latency.

18. The memory system of claim 14, wherein the first memory module is a dynamic random access memory (DRAM) module including DRAM devices and each of the second through k-th memory modules is a solid state disk (SSD) module including SSD devices.

19. A method of operating a memory system including a memory controller, a first memory module directly coupled to the memory controller through a first memory bus and second through k-th memory modules coupled to the first memory module through a second memory bus (k being a natural number greater than two), the method comprising:
receiving, by the first memory module, write data, a command/address, and a control signal from the memory controller, the command/address and the control signal being associated with the write data;
storing the write data in one or more memory devices in the first memory module when the first memory module is selected by a chip selection signal in the control signal; and
re-driving the write data, by the first memory module, to be provided to one of the second through k-th memory modules when one of the second through k-th memory modules is selected by the chip selection signal.

20. The method of claim 19, wherein the first memory module is different kind from each of the second through k-th memory modules,
wherein the first memory module is directly coupled to the memory controller with a point-to-point connection through the first memory bus, and
wherein the second through k-th memory modules are coupled to the first memory module with a multi-drop connection through the second memory bus.

* * * * *